(12) United States Patent
Demadrille et al.

(10) Patent No.: US 10,655,016 B2
(45) Date of Patent: May 19, 2020

(54) ORGANIC DYE WITH IMPROVED EFFICIENCY AND USES THEREOF IN PHOTOVOLTAIC CELLS

(71) Applicant: COMMISSARIAT À L'ÉNERGIE ATOMIQUE ET AUX ÉNERGIES ALTERNATIVES, Paris (FR)

(72) Inventors: Renaud Demadrille, Saint-Egreve (FR); Yann Kervella, Saint-Verand (FR); Damien Joly, Sassenage (FR); Maxime Godfroy, Lans-En-Vervors (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/099,623

(22) PCT Filed: May 3, 2017

(86) PCT No.: PCT/EP2017/060528
§ 371 (c)(1),
(2) Date: Nov. 7, 2018

(87) PCT Pub. No.: WO2017/194368
PCT Pub. Date: Nov. 16, 2017

(65) Prior Publication Data
US 2019/0144677 A1   May 16, 2019

(30) Foreign Application Priority Data
May 9, 2016  (FR) ..................................... 16 54125

(51) Int. Cl.
*C09B 23/10* (2006.01)
*C09B 57/00* (2006.01)
(Continued)

(52) U.S. Cl.
CPC .......... *C09B 23/102* (2013.01); *C09B 23/105* (2013.01); *C09B 57/008* (2013.01);
(Continued)

(58) Field of Classification Search
CPC ... C09B 23/102; C09B 23/105; C09B 57/008; H01G 9/2036; H01G 9/2059; H01L 31/022466
See application file for complete search history.

(56) References Cited

U.S. PATENT DOCUMENTS

2007/0073052 A1   3/2007  Velusamy et al.
2014/0290748 A1*  10/2014  Demadrille ......... H01L 51/0061
                                              136/263

FOREIGN PATENT DOCUMENTS

WO   2009/109499 A1   9/2009
WO   2013/068588 A1   5/2013

OTHER PUBLICATIONS

International Search Report for PCT/EP2017/060528 dated Jun. 26, 2017.
(Continued)

*Primary Examiner* — Susan D Leong
(74) *Attorney, Agent, or Firm* — Pearne & Gordon LLP

(57) ABSTRACT

An organic dye corresponding to one of the following structures (I) or (II): eD-pi-conjugated chromophore-L-A (I), or A-L-pi-conjugated chromophore-eD (II), where eD represents an electron donor segment, L represents a covalent bond or a spacer segment and in particular a pi-conjugated spacer segment, A represents an electron acceptor segment capable of forming a covalent bond with a semiconductor, in which the pi-conjugated chromophore comprises at least one unit of formula (III):

(Continued)

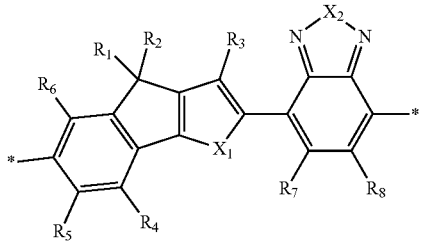

in which the radicals R1 and R2, which are identical or different, represent an optionally substituted aryl group; the radicals R3 to R8, which are identical or different, represent a hydrogen, an optionally substituted alkyl group or an optionally substituted aryl group; and X1 and X2, which are identical or different, are chosen from S, Se and O.

15 Claims, 3 Drawing Sheets

(51) Int. Cl.
    *H01G 9/20*         (2006.01)
    *H01L 31/0224*    (2006.01)

(52) U.S. Cl.
    CPC ......... *H01G 9/2036* (2013.01); *H01G 9/2059* (2013.01); *H01L 31/022466* (2013.01)

(56) References Cited

OTHER PUBLICATIONS

Written Opinion for PCT/EP2017/060528 dated Jun. 26, 2017.
O'Regan & Gratzel, 1991, «A low-cost, high-efficiency solar cell based on dye-sensitized colloidal TiO2 films», Letters to Nature, vol. 353, pp. 737-740.
Gratzel, 2009, «Recent advances in sensitized mesoscopic solar cells», Accounts of Chemical Research, vol. 42, No. 11, pp. 1788-1798.
Mishra et al, 2009, «Metal-Free Organic Dyes for Dye-Sensitized Solar Cells: From Structure: Property Relationships to Design Rules», Angewandte Chemie Int. Ed., vol. 48, pp. 2474-2499.
Yan et al., 2010, «Effect of surface etching on the efficiency of ZnO-based dye-sensitized solar cells», Langmuir, vol. 26, No. 10, pp. 7153-7156.
Idigoras et al., 2015, «Organic dyes for the sensitization of nanostructured ZnO photoanodes: effect of the anchoring functions», RSC Adv., vol. 5, pp. 68929-68938.
Ooyama et al., 2009, «Molecular designs and syntheses of organic dyes for dye-sensitized solar cells», Eur. J. Org. Chem., pp. 2903-2934.
Wang et al., 2005, «A high molar extinction coefficient sensitizer for stable dye-sensitized solar cells», J. Am. Chem. Soc., vol. 127, pp. 808-809.
Chen et al., 2007, «Effect of tetrahydroquinoline dyes structure on the performance of organic dye-sensitized solar cells», Chem. Mater., vol. 19, pp. 4007-4015.
Wu et al., 2010, «Efficient and stable dye-sensitized solar cells based on phenothiazine sensitizers with thiophene units», Journal of Materials Chemistry, vol. 20, pp. 1772-1779.
Xu et al., 2008, «New triphenylamine-based dyes for dye-sensitized solar cells», J. Phys. Chem. C, vol. 112, pp. 874-880.
Liu et al., 2008, «Simple organic molecules bearing a 3,4-ethyledioxythiophene linker for efficient dye-sensitized solar cells», Chem. Commun., pp. 5152-5154.
Zeng et al., 2010, «Efficient dye-sensitized solar cells with an organic photosensitizer featuring orderly conjugated ethylenedioxythiophene and dithienosilole blocks», Chem. Mater., vol. 22, pp. 1915-1925.
Mathew et al., 2014, «Dye-sensitized solar cells with 13% efficiency achieved through the molecular engineering of porphyrin sensitizers», Nat. Chem., vol. 6, pp. 242-247.
Joly et al., 2014, «A robust organic dye for dye sensitized solar cells based on iodine/iodide electrolytes combining high efficiency and outstanding stability», Scientific Reports, vol. 4, pp. 1-7.
Joly et al., 2015, «Metal-free organic sensitizers with narrow absorption in the visible for solar cells exceeding 10% efficiency», Energy Environ. Sci., vol. 8, pp. 2010-2018.
Kalyanasundaram, 2010, «Dye-Sensitized Solar Cells», (ed.), EPFL Press, ISBN: 978-2-940222-36-0 CRC Press ISBN 978-1-4398-0866-5.
Preliminary French Search Report for Application No. 1654125, dated Jan. 9, 2017.

\* cited by examiner

ORGANIC DYE WITH IMPROVED EFFICIENCY AND USES THEREOF IN PHOTOVOLTAIC CELLS

CROSS-REFERENCE TO RELATED APPLICATIONS

This is a National Stage application of PCT international application PCT/EP2017/060528, filed on May 3, 2017, which claims the priority of French Patent Application No. 16 54125, filed May 9, 2016, both of which are incorporated herein by reference in their entirety.

TECHNICAL FIELD

The present invention pertains to the field of photoelectric energy and in particular to the field of photovoltaic cells and devices.

More particularly, the present invention proposes a family of purely organic compounds based on pi-conjugated chromophores and the utilization thereof as electrode photosensitizers in photovoltaic devices.

The compounds of the present invention have extensive absorption spectra in the visible region and high molar absorption coefficients. As a result, photovoltaic conversion efficiencies are high in the different researched configurations of solar cells (liquid electrolyte, ionic liquid electrolyte and solid electrolyte). In addition, the compounds of the present invention, in particular through their judicious functionalization, allow devices to be obtained having high stabilities ranking among the highest in the prior art.

STATE OF THE PRIOR ART

At the current time, the best hybrid solar cells are produced from a massive nanostructured semiconductor which is generally a transparent titanium oxide ($TiO_2$). The surface of this oxide is functionalized by grafting photosensitive dyes which very often are organometallic. An electrolyte, generally liquid but it may also be a p-type semiconductor gel or solid, completes the system, trapped between two transparent electrodes. This type of cell allows the fabrication of semi-transparent panels of varied colours depending on the chosen dye.

In this type of cell, the solar photons are absorbed by the dyes and the photo-generated electron charges are then injected from these dyes into the oxide the function of which is to convey the electrons towards the electrode. FIG. 1 schematizes the different constituents of said photovoltaic cell [1].

To summarize, in these cells the separation of the charges photo-generated in the dye takes place at the interface between the dye, the semiconductor and the electrolyte, meaning that the dye is one of the essential elements of the device.

The most widely used dyes in this field up until the early 2000s were organometallic complexes generally ruthenium-based with conversion efficiencies of between 11 and 12% [2]. The chief disadvantage of hybrid cells, which are among the most efficient in the field of alternative cells to so-called conventional technologies, lies in the fact that a ruthenium-based organometallic dye is extremely costly and potentially toxic. Ruthenium is one of the 9 rarest metals on earth, thereby leading to an extremely volatile price of this raw material. Finally, ruthenium is a toxic element and some the derivatives thereof are identified as being carcinogenic or mutagenic.

The replacement of ruthenium complexes in solar cells by low-cost organic compounds that are less toxic having optoelectronic properties that are easily modulated, is therefore desirable to allow the large-scale development of dye-sensitized solar cells.

Recently, dyes in the form of purely organic molecules have been developed and efficiently employed (between 8 and 10%) in photovoltaic cells [3].

In general, it is mandatory that these sensitizers should have energy levels having positions well-adjusted to the redox potential of the electrolyte and at the conduction band of the oxide. However, one crucial point concerns the absorption properties of the molecules which must be capable, intensely and over a broad range of wavelengths, of absorbing the photons emitted by the sun. In addition, the anchoring function that these molecules should possess, to attach themselves in stable manner onto the surface of the oxide, is also of importance: it must be adapted to the surface of the oxide.

Most organic compounds employed are designed and constructed along the following scheme:

Scheme 1:

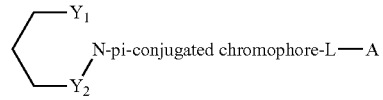

Principle of Organic Dye Design

They therefore have:
- an electron-donor segment (eD) having stable redox properties i.e. a redox function of arylamine type ($-N(Y_1)(Y_2)$) allowing the dye to be more easily reduced by the electrolyte;
- a pi-conjugated portion, of greater or less extent, allowing efficient absorption of solar photons and enabling the charges to be evacuated more easily into the oxide;
- and finally, an anchoring function of electron-acceptor nature (A) of carboxylic or cyano-acrylic type and linked to the pi-conjugated system of the molecule by a spacer (L) preferably comprising an ethylene function.

This anchoring function allows the grafting and sensitization of particles by facilitating the electronic transfer of electron-deficient aromatic nuclei towards the oxide. It is to be noted however that the anchoring function of carboxylic type is particularly well suited for grafting onto $TiO_2$ but less for ZnO. Risks of chemical attack of ZnO and degradation of the layer are to be feared if a carboxylic group is used [4,5].

The rules for designing these dyes are set forth in the article by Ooyama and Harima [6]. On the basis of these rules, numerous dyes have recently been developed and/or published or patented in the field of photovoltaic cells, but some limitations subsist with current dyes.

To increase the performance of the dyes in devices, it appears to be crucial to improve their absorption properties i.e. to increase the spectral range of photon absorption, ideally in the visible region of the solar spectrum, and to increase the molar absorption coefficients of the molecules. To summarize, the dye molecules must absorb solar photons intensely and over a broad range. Another point appears to be crucial: improvement of the stability of dyes basing their design on robust pi-conjugated units.

The strategy aimed at increasing the absorption coefficients of dyes was employed for the first time in 2005, using ruthenium complexes. By modifying the heteroleptic ligands, i.e. by introducing vinylene units or chromophores which act as antennae on the latter, an increase in their absorption coefficients was observed [7]. This results in an improvement in the photovoltaic properties of the system.

Numerous studies have endeavored to improve the molar absorption coefficients of ruthenium-based compounds. However, surprisingly, there is no study which specifically aims at improving the molar absorption coefficients of existing organic dyes or improving the stabilities thereof.

Therefore, the molar absorption coefficients of purely organic dyes currently employed remain low. This is the case for example with the dyes described in international application WO 2009/109499 [8] for which the molar absorption coefficients are all lower than 48000 $M^{-1} \cdot cm^{-1}$ and the conversion efficiencies are all lower than 5.1%, when the cells are fabricated with a liquid electrolyte and a co-adsorbent of chenodeoxycholic acid type, the structure thereof being given below:

Scheme 2: Structure of chenodeoxycholic acid

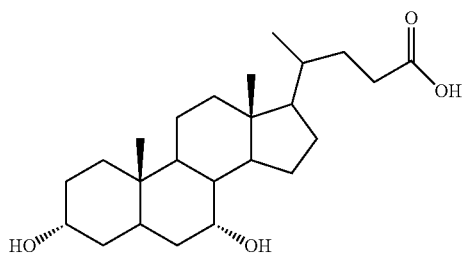

Other examples are reported in the literature [9-12]. However, the same problem is encountered with molar absorption coefficients that are all lower than 40000 $M^{-1} \cdot cm^{-1}$ and the efficiencies of cells fabricated with a $TiO_2$ electrode and liquid electrolyte are lower than 4.5%.

In 2008, an article reported the use of an EDOT-based dye (3,4-ethylenedioxythiophene) with spectra largely offset in the visible region and, although molar absorption coefficients were again low, fairly high efficiencies (in the region of 7%) were obtained [13].

At the current time, the most efficient dyes are dyes which comprise porphyrin units [14]. Performance levels with these compounds reach conversion efficiencies of 12 to 13% with a cobalt-based liquid electrolyte. However, these record efficiencies are not accompanied by good stabilities. Indeed, the porphyrin cells are not stable and lifetime estimates of devices containing the same are rarely found in the literature, the stability of these solar cells not exceeding 1000 h. Efficiency losses are often more than 25% of the initial efficiency after this irradiation time.

Since 2012, new families of organic dyes have been described having performance levels reaching 10.2% efficiency with a liquid electrolyte and 7.4% with an ionic liquid, these families having remarkable stabilities. Some of these dyes are among the most stable ever reported in the literature [15-17].

The inventors set themselves the objective of proposing novel organic dyes having improved optical properties both in terms of shift in the visible region of the solar spectrum corresponding to a spectral range of between 400 and 800 nm and in terms of molar absorption coefficient to improve properties of both efficiency and stability of photovoltaic devices containing the same.

DESCRIPTION OF THE INVENTION

The present invention allows all or part of the above-listed technical problems to be solved, and in particular problems related to the stability and efficiency of solar cells.

Studies conducted by the inventors have allowed the synthesis of novel organic dyes, and more particularly of pi-conjugated chromophores included therein, having associations of particular functional groups such as 4H-indeno [1,2-b]thiophenes with benzothiadiazoles, thiophenes, phenyls and furans. Said dyes used as photosensitizers in photovoltaic devices based on a metal oxide allow (i) shifting of the maximum absorption band (λmax) in the visible portion of the solar spectrum, (ii) a significant increase in the molar absorption coefficient, (iii) an improvement in photovoltaic conversion efficiencies, and (iv) an improvement in the stability of devices employing the same.

The present invention therefore concerns an organic dye corresponding to one of the following structures (I) or (II):

$$\text{eD-pi-conjugated chromophore-L-A} \qquad (I)$$

$$\text{A-L-pi-conjugated chromophore-eD} \qquad (II)$$

where:
- eD represents an electron-donor segment,
- L represents a covalent bond or spacer segment and in particular a pi-conjugated spacer segment,
- A represents an electron-attractor segment capable of forming a covalent bond with a semiconductor, wherein the pi-conjugated chromophore comprises at least one unit of formula (III):

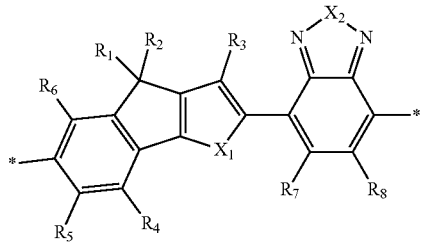

where:
- the radicals $R_1$ and $R_2$, the same or different, are an optionally substituted aryl group;
- the radicals $R_3$ to $R_8$, the same or different, are a hydrogen, an optionally substituted alkyl group or optionally substituted aryl group; and
- $X_1$ and $X_2$, the same or different, are selected from among S, Se and O.

In the unit (III) contained in the pi-conjugated chromophore of the dye of the present invention, the radicals $R_1$ and $R_2$ are necessarily aromatic groups. Studies by the inventors found that the stability of said dyes is improved when using optionally substituted aryl units instead of the alkyl groups in compounds known in the prior art.

Therefore, judicious modification of the structure of recently invented dyes that are mentioned in documents [15-17] leads to the novel family of dyes of the invention which have improved optical properties both in terms of spectral shift in the visible region and in terms of molar absorption coefficient. The dyes based on 4,4'-bis(aryl)-4H-indeno[1,2-b]thiophene units judiciously substituted at position 4 and combined with a benzothiadiazole unit at alpha position of thiophene allow an improvement in properties of both efficiency and stability of devices containing the same. The beneficial effect of this simple modification compared with the RK1 and RKF structure published in [17] could not be anticipated on the basis of pre-existing results. This improvement in properties is also expected if one or both sulfur atoms in these dyes are replaced by an oxygen or selenium atom.

In addition, the organic dyes of the present invention are synthesized in much simpler manner by means of this structural modification. The synthesis of derivatives of the RKF family known in the literature requires 9 steps and gives a global efficiency of about 10%. When the alkyl substituents of RKF are replaced by optionally substituted aryl substituents such as substituted phenyls, to give a compound of the invention, the number of steps is reduced to 6 and the global efficiency of the synthesis is of the order of 26%.

Advantageously, the organic dye of the present invention corresponds to structure (I) such as previously defined.

By «alkyl group» in the present invention is meant a linear, branched or cyclic alkyl group having 1 to 20 carbon atoms, particularly 1 to 15 carbon atoms, in particular 1 to 10 carbon atoms, optionally comprising at least one heteroatom e.g. a methyl, ethyl, n-propyl, isopropyl, butyl, isobutyl, sec-butyl, tert-butyl, pentyl, isopentyl, hexyl, heptyl, octyl, nonyl or decyl group.

By «aryl group» in the present invention is meant an aryl group having one or more rings fused or linked via a single bond or by a hydrocarbon group, each ring having 4 to 20 carbon atoms, particularly 4 to 14 carbon atoms, in particular 4 to 8 carbon atoms and optionally comprising at least one heteroatom. As examples of aryl groups mention can be made of the phenyl, biphenyl, naphthyl, anthracenyl, cyclopentadienyl, pyrenyl, tetrahydronaphthyl, furanyl, pyrrolyl, thiophenyl, oxazolyl, pyrazolyl, isoquinolinyl, thiazolyl, imidazolyl, triazolyl, pyridinyl, pyranyl, quinolinyl, pyrazinyl and pyrimidinyl groups.

By «substituted alkyl group» or «substituted aryl group» in the present invention is meant an alkyl or aryl group such as previously defined substituted by one or more groups, the same or different, selected from among: a halogen; amine; diamine; carboxyl; carboxylate; aldehyde; ester; ether; hydroxyl; halogen; an optionally substituted aryl such as previously defined and in particular such as a phenyl, benzyl or naphthyl; an optionally substituted alkyl such as previously defined and in particular such as a methyl, ethyl, propyl, butyl, pentyl, hexyl or hydroxypropyl; amide; sulfonyl; sulfoxide; sulfonic acid; sulfonate; acyl; vinyl; hydroxyl; epoxy; phosphonate; isocyanate; thiol; glycidoxy; acryloxy; thiophene; furan; selenophene and salts thereof.

Evidently, the optionally substituted aryl groups employed in the present invention also cover pi-conjugated chromophores and in particular pi-conjugated chromophores such as described in the present invention.

By «heteroatom» in the present invention is meant an atom selected from the group consisting of nitrogen, oxygen, phosphorus, sulfur, silicon, fluorine, chlorine and bromine.

By «halogen» in the present invention is meant an atom selected from the group consisting of fluorine, chlorine, iodine and bromine.

In the units (III) of the present invention the pair $(X_1,X_2)$ represents (S,S), (O,O), (Se,Se), (O,Se), (Se,O), (S,O), (O,S), (Se,S) or (S,Se). Advantageously, the pair $(X_1,X_2)$ represents (S,S), (O,O) or (Se,Se) and in particular (S,S).

Among the units (III), advantageous units are those in which the radicals $R_4$ to $R_6$ are the same and/or the radicals $R_7$ and $R_8$ are the same and in particular those in which the radicals $R_4$ to $R_6$ all represent a hydrogen and/or the radicals $R_7$ and $R_8$ all represent a hydrogen. In these advantageous units, the radical $R_3$ is typically a hydrogen.

In these advantageous units (III), the radicals $R_1$ and $R_2$ are the same and represent an optionally substituted aryl group such as previously defined.

In one particular embodiment, the radicals $R_1$ and $R_2$ are the same and represent a substituted aryl group such as previously defined. More particularly, this substituted aryl group is an aryl group substituted by an optionally substituted alkyl group such as previously defined. Still further particularly, this substituted aryl group is an aryl group substituted by a methyl, ethyl, n-propyl, isopropyl, butyl, isobutyl, sec-butyl, tert-butyl, pentyl, isopentyl, hexyl, heptyl or octyl group.

One unit (III) of particular interest in the present invention has the formula (IV):

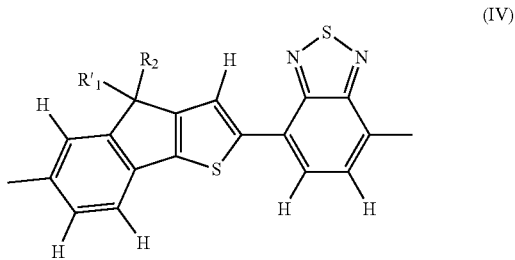

(IV)

where the radicals $R'_1$ and $R'_2$ are the same and represent —$C_6H_4$—$C_6H_{13}$.

The organic dye of the present invention comprises at least one pi-conjugated chromophore such as defined in the present invention. It may comprise at least two thereof, the same or different, or at least three the same or different. When the organic dye of the present invention comprises 2, 3 or more pi-conjugated chromophores, at least one of these chromophores is such as defined in the present invention, each of the others possibly being any pi-conjugated chromophore known to persons skilled in the art or, on the contrary, a chromophore such as defined in the present invention.

In the organic dye of the present invention, the pi-conjugated chromophore may only be composed of one unit, or of several units the same or different, such as previously indicated.

As a variant, the pi-conjugated chromophore, in addition to one or more units, the same or different such as previously described, may also comprise a $1^{st}$ pi-conjugated group separating the unit(s) from the electron-donor segment (eD) and/or a $2^{nd}$ pi-conjugated group, the same as or differing from the $1^{st}$, separating the unit(s) from the electron-attractor segment (A) or from the spacer segment (L).

In the present invention, by «pi-conjugated group» is meant a group selected from among optionally substituted alkenylene or alkynylene chains, optionally substituted arylene chains and combinations thereof.

In the present invention, by «alkenylene or alkynylene chain» is meant a linear, branched or cyclic alkenylene or alkynylene chain having 4 to 40 carbon atoms and in particular 4 to 30 carbon atoms and optionally comprising at least one heteroatom. As examples of alkenylene or alkynylene chains that can be employed, mention can be made of the groups: butenylene or butynylene, isobutenylene or isobutynylene, sec-butenylene or sec-butynylene, tert-butenylene or tert-butynylene, pentenylene or pentynylene, isopentenylene or isopentynylene, cyclopentenylene or cyclopentynylene, cyclohexenylene or cyclo hexynylene.

In the present invention, by «arylene chain» is meant an arylene chain having one or more rings fused or linked via a single bond or by a hydrocarbon group, each ring having 4 to 50 carbon atoms and in particular 4 to 40 carbon atoms and optionally comprising at least one heteroatom. As examples of arylene chains that can be employed, mention can be made of the groups phenylene, biphenylene, naphthylene, anthracenylene, cyclopentadienylene, pyrenylene, tetrahydronaphthylene, furanylene, pyrrolylene, thiophenylene, oxazolylene, pyrazolylene, isoquinolinylene, thiazolylene, imidazolylene, triazolylene, pyridinylene, pyranylene, quinolinylene, pyrazinylene and pyrimidinylene.

In the present invention by «substituted alkenylene or alkynylene chain» or by «substituted arylene chain» is meant an alkenylene or alkynylene chain or an arylene chain such as previously defined having one or more substitutions, the same or different, this or these substitutions preferably corresponding to halogen atoms or to aliphatic groups optionally comprising at least one heteroatom such as —COOR″, —CHO, —OR″, —SR″, —SCOR″, —SO$_2$R″, —NR″R‴, —CONR″R‴, —C(Hal)$_3$, —OC(Hal)$_3$, —C(O)Hal or —CN groups in which R″ et R‴ are a hydrogen atom or a hydrocarbon group such as previously defined, whilst Hal represents a halogen atom, in particular fluorine, chlorine or bromine.

By «electron-donor segment (eD)» in the present invention is meant an electron-donor function which allows easier reduction of the organic dye of the present invention by the electrolyte.

Any electron-donor segment known to skilled persons and usually used in the field of organic photo-sensitizing dyes can be used in the present invention. As examples of said electron-donor segments, those described on page 42, line 10 to page 45 line 1 of international application WO 2009/109499 [8] can be cited, and those used in the 56 organic dyes described in Mishra et al, 2009 [3].

Advantageously, the electron-donor segment employed in the present invention is an amino group of $(Z_1)(Z_2)$N-type where $Z_1$ and $Z_2$, the same or different, represent an optionally substituted alkyl group, or an optionally substituted aryl group such as previously defined. In particular, when $Z_1$ and/or $Z_2$, the same or different, represent a substituted aryl group, the latter is substituted by one or more groups, the same or different, of electron-donor nature. By «group of electron-donor nature» in the present invention is meant a group selected from among an alkyl group having 1 to 10 carbon atoms, optionally substituted; an alkoxy group having 1 to 10 carbon atoms, optionally substituted; a diamine group and in particular a di(alkyl)amino group optionally substituted on the alkyl group(s) by a hydroxy; an alkylthio group and a thioether group.

In the experimental section below, three examples of an electron-donor segment are given, these being able to be used in any organic dye of the invention. In these examples, —$Z_1$═—$Z_2$═—$C_6H_5$ (YKP88 and DJ214) or —$C_6H_4$—O—$CH_3$ (YKP89) or —$C_6H_4$—O—$C_6H_{13}$ (YKP137).

By «electron-acceptor segment (A)» in the present invention is meant an electron-acceptor function which ensures anchoring of the organic dye of the present invention on the solid substrate such as a solid substrate of metal oxide type, whilst ensuring good charge transfer between said substrate and said dye.

Any electron-acceptor segment known to skilled persons and usually employed in the field of photo-sensitizing organic dyes can be used in the present invention. As examples of such electron-acceptor segments, mention can be made of those defined on page 1, lines 26 and 27 and particularly exemplified on page 29, lines 7 to 23; page 37, lines 6 to 9; from page 46, line 6 to page 47, line 1; or page 47, lines 2 to 8 of international application WO 2009/109499 [8] and those employed in the 56 organic dyes described in Mishra et al, 2009 [3].

Advantageously, the electron-acceptor segment used in the present invention is a carboxylic acid group, cyanoacrylic acid group, phosphonic group, dithiocarboic group or a group corresponding to any of the following formulas:

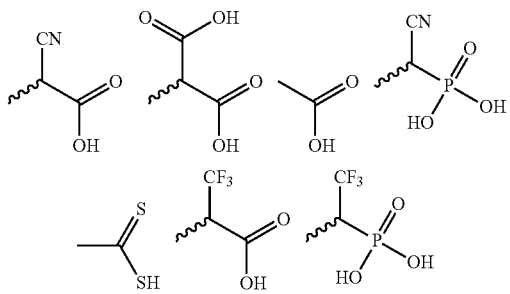

In the present invention, the pi-conjugated chromophore and the electron-acceptor segment are advantageously separated from each other by a spacer (L).

Any spacer known to skilled persons and usually employed in the field of organic photo-sensitizing dyes can be used in the present invention. As examples of said spacers, those used in the 56 organic dyes described in Mishra et al, 2009 [3] can be cited.

In the present invention, the spacer L is in particular a pi-conjugated function such as an optionally substituted alkenylene or alkynylene chain and/or an optionally substituted arylene chain such as previously defined. As spacers that particularly able to be used in the present invention, mention can be made of ethylenyl, propylenyl, butenyl, phenylene, benzylene, naphthylene, furanylene chains and any combination thereof.

Advantageously, when the spacer L used in the present invention comprises a double bond, the latter is separated from the benzothiadiazole (or benzoxadiazole or benzoselenadiazole) ring, contained in the pi-conjugated chromophore in the vicinity of the spacer, by at least one optionally substituted arylene chain such as previously defined and in particular by at least one optionally substituted thiophenylene, at least one optionally substituted phenylene as is the case with the YKP88 and YKP137 dyes exemplified below, or at least one optionally substituted furanylene as is the case with the YKP89 et DJ214 dyes exemplified below.

In particularly advantageous manner the organic dye of the present invention is selected from among the following compounds:

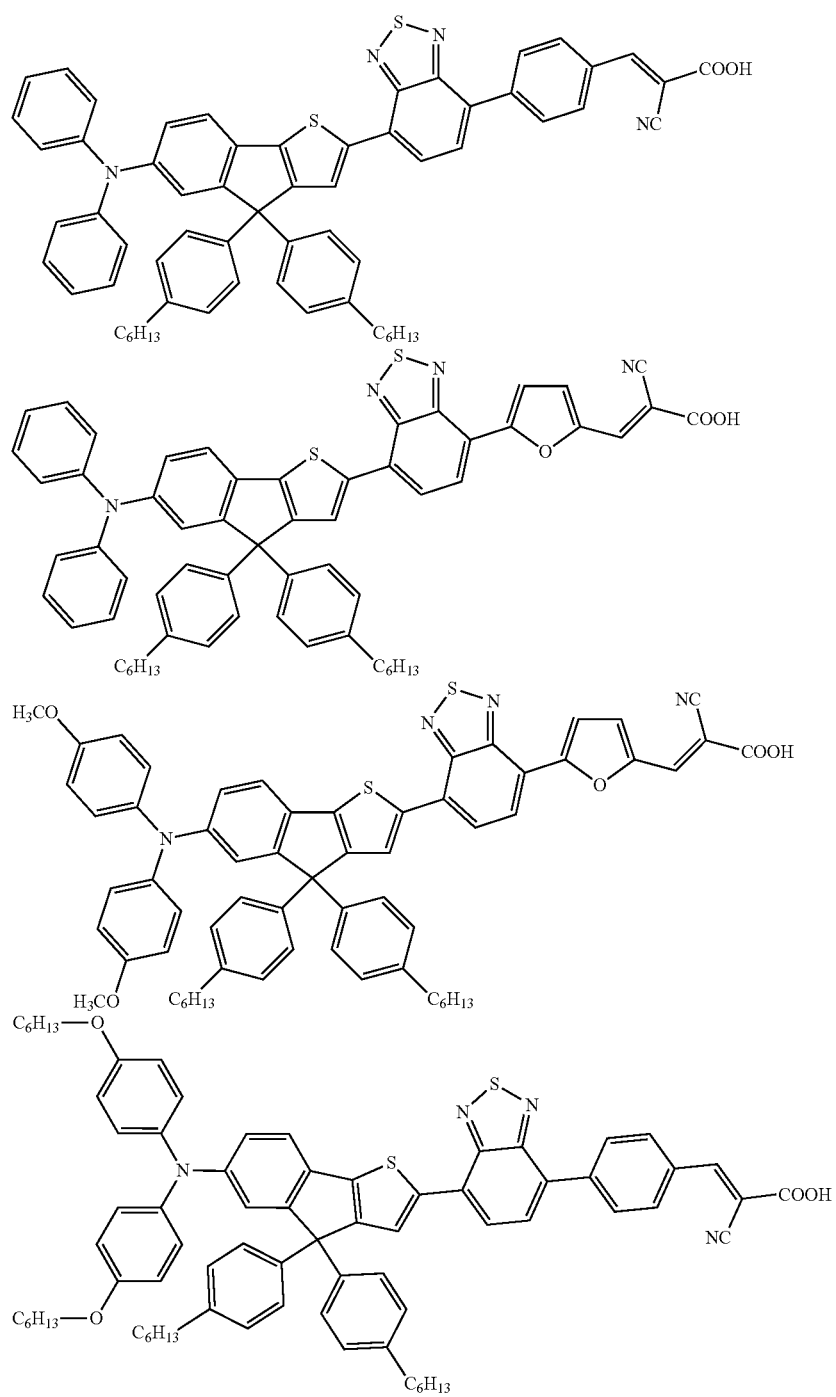

Regarding all the units and structures described in the present invention, the latter covers all stereo-isomers, all tautomers and all enantiomers that can be envisaged.

The present invention also concerns a method for preparing an organic dye such as defined in the present invention. This preparation method uses chemical reactions well known to skilled persons. Such persons, on the basis of the different protocols explained in the experimental section below and the organic dye preparation protocols in the prior art, will be able to prepare any organic dye of the present invention without any inventive effort.

The present invention further concerns an organic dye such as previously defined used as photosensitizer in a photovoltaic device.

In the present invention, the expressions «photovoltaic device» and «photovoltaic cell» are similar and can be used interchangeably.

The present invention therefore concerns the photovoltaic device thus obtained i.e. a photovoltaic device having a nanostructured, semiconductor metal oxide layer sensitized by at least one organic dye such as defined in the present invention.

In other words, the organic dye such as previously obtained has reacted with the metal oxide layer via its electron-attractor segment to give a functionalizing group derived from the organic dye i.e. covalently bonded to the metal oxide layer. These functionalizing groups therefore have an electron-donor segment (eD), a pi-conjugated chromophore, optionally a spacer (L) and a group derived from the electron-acceptor segment (A) covalently bonded to the metal oxide layer, the electron-donor segment (eD), the pi-conjugated chromophore, the spacer (L) and the electron-acceptor segment (A) being such as previously defined.

In the present invention, when the organic dye reacts with i.e. is adsorbed on the metal oxide layer, this reaction can take place in the presence of an additive such as another organic dye or a co-adsorbent.

The other organic dye that can also be adsorbed on the metal oxide layer can be (a) another dye of the present invention, (b) a mixture of dyes of the present invention, (c) another dye differing from a dye of the present invention, and (d) a mixture comprising at least one other dye of the invention and at least one other dye differing from a dye of the present invention. The experimental section below describes the results obtained using several organic dyes of the invention and an organic dye of the invention associated with another organic dye differing from a dye of the invention (Tables 2 and 3).

By «dye differing from a dye of the present invention» in the present invention is meant a dye selected from among a metal complex dye and/or an organic dye such as a dye of the types: indoline, coumarin, cyanine, merocyanine, hemocyanin, methine, azo, quinone, quinonimine, diketo-pyrrolopyrrole, quinacridone, squaraine, triphenylmethane, perylene, indigo, xanthene, eosin, rhodamine, phthalocyanine optionally metal-inserted, porphyrin optionally metal-inserted and mixtures thereof. A dye differing from a dye of the present invention can also be any of the organic dyes described in [15-17].

As co-adsorbents that can be used in the present invention, mention can be made of steroid co-adsorbents such as deoxycholic acid, dehydrodeoxycholic acid, chenodeoxycholic acid, the methyl ester of cholic acid, the sodium salt of cholic acid or one of the mixtures thereof.

The photovoltaic device of the present invention further comprises two electrodes which, in the invention, are designated as anode and counter-electrode separated from each other by an electrolyte and optionally by polymer separators.

Advantageously, the anode used in the present invention is composed of a transparent conductive oxide layer such as a layer of fluorine-doped tin dioxide ($SnO_2$:F or FTO) or indium tin oxide (ITO), deposited on a glass plate.

In the present invention, by «semiconductor metal oxide» is meant any binary, tertiary or quaternary metal oxide. In the present invention, by «nanostructured semiconductor metal oxide» is meant any semiconductor metal oxide such as previously defined comprising pores and in particular pores having a mean size of between 20 and 500 Å i.e. any semiconductor metal oxide such as previously defined that is mesoporous. Therefore, the nanostructured semiconductor metal oxide layer in the form of a mesoporous layer is deposited on the anode such as previously defined.

In the present invention, by «binary metal oxide» is meant a metal oxide of type $M^{II}O$, $M^{III}_2O_3$ or $M^V_2O_5$ with M representing a mono-, bi-, tri-, pentavalent metal and O the oxygen atom. As examples of said binary metal oxides, mention can be made of $TiO_2$, ZnO, $SnO_2$, $Nb_2O_5$, $In_2O_3$ and $RuO_2$.

In the present invention, by «tertiary metal oxide» is meant a multi-cation metal oxide of MM'O type with M and M' representing two different bivalent metals. For indication, $Zn_2SnO_4$, $SrTiO_4$, $SrTiO_3$, $BaSnO_3$ can be cited.

In the present invention, by «quaternary metal oxide» is meant a composition of mixed oxides. In the present invention, by «composition of mixed oxides» is meant:
a mixture of two binary oxides such as previously defined, For example mixtures such as $(ZnO)_{1-x}$—$(SnO_2)_x$, $(TiO_2)_{1-x}$—$(Nb_2O_5)_x$ can be mentioned; or
a mixture of a binary oxide and a tertiary oxide such as previously defined. A mixture of $(SnO_2)$—$(SrTiO_3)$ can be cited for example.

Regarding the photovoltaic device of the present invention, the electrolyte can be a liquid, an ionic liquid, a gel or a solid. Said electrolyte is in particular such as presented in the book by Kalyanasundaram K., 2010 [18].

When the electrolyte is a liquid electrolyte, it is advantageously selected from among usual liquid electrolytes such as $I^-/I_3^-$, $Br^-/Br_2$, $SCN^-/(SCN)_2$ or cobalt complexes of Co(III/II) type.

When the electrolyte is an electrolyte of gel or ionic liquid type, it is advantageously selected from among imidazolium salts such as, these examples being non-exhaustive, 1-ethyl-3-methylimidazolium selenocyanate (EMlSeCN), 1-ethyl-3-methylimidazolium thiocyanate (EMlSCN) or 1-methyl-3-n-hexylimidazolium iodide (MHlmI).

When the electrolyte is an electrolyte of solid type, it is advantageously selected from among a p-type semiconductor solid, such as a polymer or small molecule able to be deposited via liquid route. More particularly, the electrolyte of solid type able to be used in the present invention is selected from among the Spiro-OMeTAD compound or a derivative of triarylamine. It is also possible to use a pi-conjugated polymer such as poly(3,4-ethylenedioxythiophene) (PEDOT) for example or a mixture of PEDOT and sodium polystyrene sulfonate (SPS) known under the abbreviation PEDOT:SPS. It is also possible to use a polymer of poly(ethylene oxide) type containing a redox pair, or polyaniline.

Irrespective of the type of electrolyte used in the present invention, the latter also comprises a redox pair such as the $I^-/I_3^-$ redox pair or a cobalt complex and optionally 4-tert-butylpyridine (tert-BP) and/or an anion of bis(trifluoro-methanesulfonyl)imide type (TFSI) such as lithium bis(trifluoro-methanesulfonyl)imide (Li-TFSI) in particular, to improve the conductivity of the electrolyte.

In the present invention by «polymer separator» is meant a thermal adhesive polymer allowing crimping of the two electrodes. Said adhesive polymers are adhesives obtained in particular from Solaronix such as those in the Amosil range or Meltonix range, or adhesives in the FastelFilm range by Dupond. These polymers are in the form of thick thermo-bonding, thermoplastic sheets. A seal is obtained when the polymer is heated to about 100° C. for a few seconds, for example using a vacuum laminator, hot press or soldering iron for small surfaces. Typically, the seals or strips are cut out and arranged on the electrode substrate before hot lamination.

Finally, the counter-electrode of the photovoltaic device of the present invention is composed of a metal layer such as a layer of gold or platinum deposited on a solid transparent substrate such as a substrate in a transparent conducting oxide e.g. a substrate in FTO or ITO applying an operating mode well known to those skilled in the art.

Other characteristics and advantages of the present invention will become further apparent to persons skilled in the art on reading the following nonlimiting examples given for illustration, with reference to the appended Figures.

DETAILED DESCRIPTION OF PARTICULAR EMBODIMENTS

Figure 1:
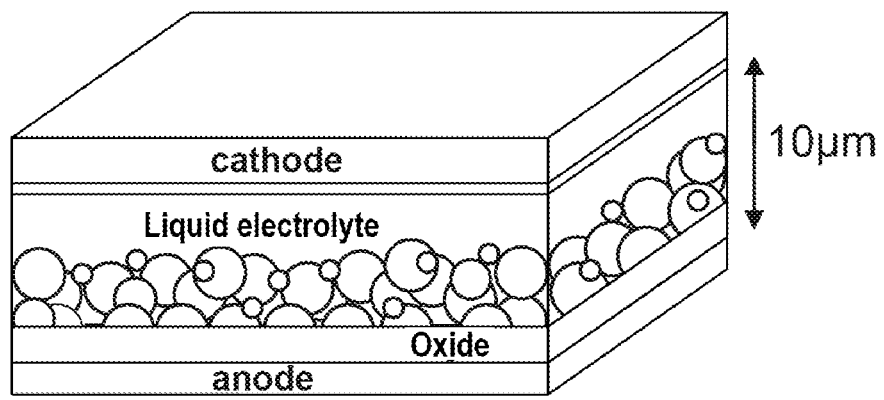
FIG. 1 is a schematic illustration of a photovoltaic cell such as described in the article by O'Regan and Grätzel, 1991 [1].

I. Synthesis of the YKP88 Dye.

I.1. Methyl 5-bromo-2-(thiophen-2-yl)benzoate [YKC4P80]

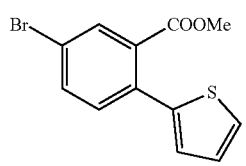 [SMILES: COC(=O)c1cc(Br)ccc1-c1cccs1]

In an argon atmosphere, methyl 5-bromo-2-iodobenzoate (2.50 g, 7.33 mmol) and tetrakis(triphenylphosphine)palladium (423 mg, 5 mol %) were dissolved in 30 mL of tetrahydrofuran (THF). At ambient temperature 2-thienylzinc bromide (1.67 g, 7.33 mmol) was added dropwise, the solution was vigorously stirred and heated to 70° C. overnight. The reaction was stopped with a 2M solution of HCl and the organic phase extracted with diethylether, washed with water and brine, dried over sodium sulfate (Na$_2$SO$_4$), filtered and concentrated in vacuo. The crude product was purified by silica gel chromatography eluting with n-hexane/dichloromethane (DCM): 9:1 (v/v) then 7:3 (v/v), whereby a colourless oil was obtained (2.15 g, 7.24 mmol, 98.7%).

$^1$H NMR (CDCl$_3$, 200 MHz): δ=7.86 (dd, 1H, 1=4.8 Hz, 1=0.3 Hz, H$_{ar}$), 7.61 (dd, 1H, J=2.1 Hz, 1=8.3 Hz, H$_{ar}$), 7.35 (m, 2H, H$_{ar}$), 7.04 (m, 2H, H$_{ar}$), 3.75 (s, 3H).

$^{13}$C NMR (CDCl$_3$, 50 MHz): δ=167.3; 141.1; 134.2; 134.1; 133.3; 133.0; 132.5; 127.7; 127.1; 136.6; 121.9; 62.1; 14.3.

I.2. 6-bromo-4,4'-bis(4-hexylphenyl)-4H-indeno[1,2-b]thiophene [YKC4P81]

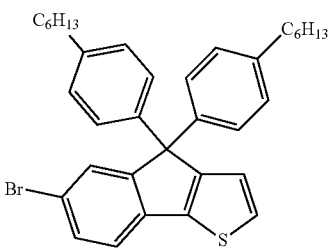

In an argon atmosphere, (4-hexylphenyl)magnesium bromide was previously prepared from 1(4-bromophenyl)hexane (2.0 g, 8.29 mmol) and magnesium (202 mg, 8.29 mmol, 1 eq) in 10 mL of freshly distilled THF. This reaction mixture was placed under reflux for 1 h. In a second flask, methyl 5-bromo-2-(thiophen-2-yl)benzoate [YKC4P80] (1 g, 3.37 mmol) was solubilized in 15 mL of THF. Grignard reagent was added dropwise and the solution heated under reflux for 5 h. After cooling to ambient temperature, the crude mixture was poured into water. The organic phase was extracted twice with ethyl acetate and washed with water and brine, dried over Na$_2$SO$_4$, filtered and concentrated in vacuo. The crude product was dissolved in glacial acetic acid (40 mL). After 30 min, 4 mL of concentrated HCl were added dropwise and the mixture brought under reflux to 120° C. for 5 h. After return to ambient temperature, the acetic acid was removed by rotary evaporation and the crude product extracted with pentane. The organic layer was washed several times with water and dried over Na$_2$SO$_4$, filtered and concentrated in vacuo. The crude product was purified by silica gel chromatography eluting with n-hexane, whereby a colourless oil was obtained (1.40 g, 2.45 mmol, 72.8%).

$^1$H NMR (CDCl$_3$, 400 MHz): δ=74.7 (d, 1H, J=0.7 Hz), 7.40 (dd, 1H, J=1.8 Hz, J=8.0 Hz, H$_{ar}$), 7.31 (d, 1H, J=4.9 Hz, H$_{ar}$), 7.30 (d, 1H, 1=8.0 Hz, H$_{ar}$), 7.05 (ABq, 8H, Δvab=13.3 Hz, J=8.38 Hz, H$_{ar}$), 6.99 (d, 1H, J=4.9 Hz, H$_{ar}$), 2.54 (t, 4H), 1.57 (m, 4H), 1.29 (m, 12H), 0.87 (t, 6H).

$^{13}$C NMR (CDCl$_3$, 100 MHz): δ=156.17; 155.54; 141.42; 414.00; 139.69; 136.06; 130.54; 129.32; 128.44; 128.16; 127.44; 122.91; 120.25; 118.94; 35.33; 31.50; 31.11; 28.91; 22.38; 13.87.

I.3. 4,4-bis(4-hexylphenyl)-N,N-diphenyl-4H-indeno[1,2-b]thiophen-6-amine [YKC4P84]

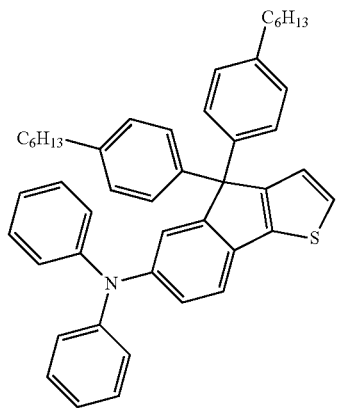

In an argon atmosphere, tris(dibenzylideneacetone) dipalladium (Pd$_2$dba$_3$) (4 mg, 4.37 μmol) and tri-tert-butylphosphine tetrafluoroborate (2.54 mg, 8.75 μmol) were dissolved in anhydrous toluene (5 mL). After agitation for 15 min, a solution of 6-bromo-4,4'-bis(4-hexylphenyl)-4H-indeno[1,2-b]thiophene [YKC4P81] (250 mg, 437.3 μmol) and diphenylamine (81.4 mg, 481.0 μmol) in anhydrous toluene (10 mL) was added. Potassium tert-butoxide (161.94 mg, 1.44 mmol, 3.3 eq) was added and the resulting mixture agitated for 30 min at ambient temperature, before being placed under reflux for 48 h. The mixture was then filtered through Celite and poured into HCl (2 M). The organic phase was extracted with DCM, dried over Na$_2$SO$_4$ and concentrated. The crude oil was purified by silica gel chromatography eluting with n-hexane/DCM: 9:1 (v/v) whereby a pale yellow oil was obtained (266 mg, 403 µmol, 92.2%).

$^1$H NMR (CDCl$_3$, 400 MHz): δ=7.28 (d, 1H, J=8.2 Hz, H$_{ar}$), 7.22 (d, 1H, J=8.2 Hz, H$_{ar}$), 7.22 (S, 1H, H$_{ar}$), 7.18 (m, 4H, H$_{ar}$), 7.04 (m, 7H, H$_{ar}$), 6.98 (m, 7H, H$_{ar}$), 6.95 (m, 1H, H$_{ar}$), 6.93 (d, 1H, J=2.1 Hz, H$_{ar}$), 2.53 (t, 4H, CH$_2$), 1.55 (m, 4H, CH$_2$), 1.28 (m, 12H, CH$_2$), 0.87 (t, 6H, CH$_3$).

$^{13}$C NMR (CDCl$_3$, 100 MHz): δ=154.99; 147.50; 145.37; 141.69; 140.98; 131.91; 128.87; 127.92; 127.53; 126.74; 123.69; 123.01; 122.95; 122.53; 119.56; 62.6; 35.31; 31.52; 31.16; 29.49; 28.89; 22.39; 13.88.

I.4. 4-(7-(6-(diphenylamino)-4,4-bis(4-hexylphenyl)-4H-indeno[1,2-b]thiophen-2-yl)benzo[c][1,2,5]thiadiazol-4-yl)benzaldehyde [YKC4P87]

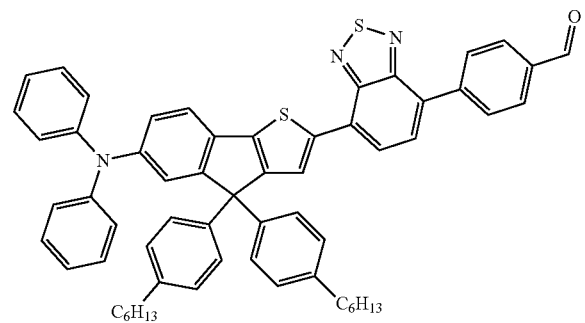

In an argon atmosphere, 4,4-bis(4-hexylphenyl)-N,N-diphenyl-4H-indeno[1,2-b]thiophen-6-amine (240 mg, 364 µmol) was dissolved in distilled THF (15 mL). After bringing the solution to −78° C., n-butyllithium (n-BuLi) (279 µL, 418 µmol, 1.15 eq) was added. The solution was left under agitation for 1 h at −78° C. before adding a solution of trimethyl tin chloride (Me$_3$SnCl) (545 µL, 545 µmol, 1.5 eq) in n-hexane at −78° C. After return to ambient temperature, the solution was left under agitation for 2 h. The reaction was stopped with a saturated ammonium chloride solution. The organic phase was extracted with n-hexane, washed with water and dried over Na$_2$SO$_4$, filtered and concentrated in vacuo. The resulting oil was subjected without further purification to Stille coupling with 4-bromo-7-(4-formylbenzyl)-2,1,3-benzothiadiazole (93 mg, 291 µmol, 0.8 eq). The stannic product was placed under an argon atmosphere with Pd$_2$dba$_3$ (6.66 mg, 7.27 µmol, 2 mol %) and Tri(o-tolyl)phosphine (P(o-tolyl)$_3$) (4.41 mg, 14.55 µmol, 4 mol %). The products were dissolved in anhydrous toluene (20 mL) and placed under reflux for 24 h. The mixture was then poured into HCl (2 M). The organic phase was extracted with DCM, washed with water, dried over Na$_2$SO$_4$ and concentrated. The crude solid was purified by silica gel chromatography eluting with n-hexane/DCM: 6:4 (v/v), whereby a dark red solid of aldehyde type was obtained (195 mg, 217 µmol, 74.6%).

$^1$H NMR (CD$_2$Cl$_2$, 400 MHz): δ=10.09 (s, 1H, CHO), 8.15 (s, 1H, H$_{ar}$), 8.10 (ABq, 4H, Δvab=65.6 Hz, J=8.3 Hz, H$_{ar}$), 7.88 (ABq, 2H, Δvab=60.9 Hz, J=7.6 Hz, H$_{ar}$), 7.42 (d, 2H, J=8.2 Hz, H$_{ar}$), 7.23 (m, 4H, H$_{ar}$), 7.15 (m, 5H, H$_{ar}$), 7.08-6.98 (m, 12H, H$_{ar}$), 2.56 (t, 4H, J=7.6 Hz, CH$_2$), 1.57 (m, 4H, CH$_2$), 1.30 (m, 12H, CH$_2$), 0.87 (t, 6H, J=6.7 Hz, CH$_3$).

$^{13}$C NMR (CD2Cl2, 100 MHz): δ=192.00; 156.15; 155.56; 154,05; 152.73; 147.85; 146.87; 143.54; 143.43; 142.03; 141.95; 141.49; 136.09; 131.59; 130.73; 130.00; 129.51; 129.25; 128.62; 128.36; 128.02; 124.60; 124.28; 123.32; 123.05; 122.14; 120.60; 63.59; 35.75; 32.03; 31.79; 29.40; 22.91; 14.16.

I.5. 2-cyano-3-(4-(7-(6-(diphenylamino)-4,4-bis(4-hexylphenyl)-4H-indeno[1,2-b]thiophen-2-yl)benzo[c][1,2,5]thiadiazol-4-yl)phenyl)acrylic Acid [YKP88]

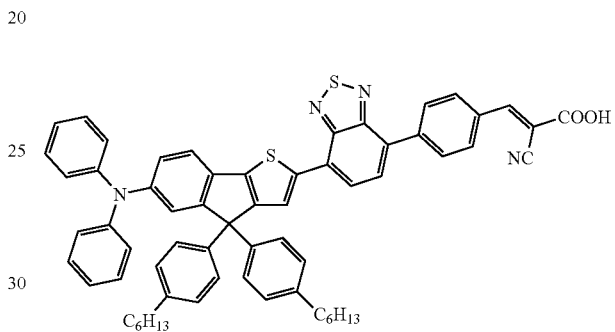

In an argon atmosphere, 4-(7-(6-(diphenylamino)-4,4-bis(4-hexylphenyl)-4H-indeno[1,2-b]thiophen-2-yl)benzo[c][1,2,5]thiadiazol-4-yl)benzaldehyde [YKC4P87] (180 mg, 200 µmol) and cyanoacetic acid (85 mg, 1 mmol, 5 eq) were dissolved in a mixture of acetonitrile (9 mL) and chloroform (9 mL). A catalytic amount of piperidine was added and the solution placed under reflux for 3 h. The solvent was removed under reduced pressure and the remaining solid was dissolved in chloroform. The organic phase was washed with a 2M solution of HCl, dried over Na$_2$SO$_4$ and concentrated. The crude solid was purified by silica gel chromatography eluting first with DCM, then DCM/methanol (MeOH): 95:5 (v/v) and finally DCM/MeOH/Acetic acid: 90:5:5 (v/v), whereby the corresponding dye was obtained in the form of a dark red solid (179.3 mg, 186 µmol, 92.7%).

$^1$H NMR (THF-d$_8$, 400 MHz): δ=8.33 (s, 1H, H$_{ar}$), 8.25 (ABq, 4H, Δvab=39.9 Hz, J=8.2 Hz, H$_{ar}$), 8.26 (s, 1H, H$_{ar}$), 8.05 (ABq, 4H, Δvab=51.4 Hz, J=7.5 Hz, H$_{ar}$), 7.44 (d, 1H, J=8.2 Hz, H$_{ar}$), 7.22-7.185 (m, 4H, H$_{ar}$), 7.14 (m, 3H, H$_{ar}$), 7.05-7.02 (m, 6H, H$_{ar}$), 6.99-6.95 (m, 2H, H$_{ar}$), 2.58 (t, 4H, J=7.6 Hz, CH$_2$), 1.57 (m, 4H, CH$_2$), 1.29 (m, 12H, CH$_2$), 0.87 (t, 6H, J=5.8 Hz, CH$_3$).

$^{13}$C NMR (THF-d$_8$, 100 MHz): δ=164.18; 157.44; 156.82; 155.00; 154.36; 153.83; 149.08; 147.92; 144.78; 143.26; 142.85; 142.50; 132.98; 132.25; 131.33; 130.91; 130.40; 130.11; 129.43; 129.16; 125.66; 125.49; 124.25; 124.15; 123.50; 121.47; 116.74; 105.05; 64.73; 36.80; 33.12; 32.96; 31.05; 30.50; 23.90; 14.83.

II. Synthesis of the DJ214 Dye.

II.1. 5-(7-(6-(diphenylamino)-4,4-bis(4-hexylphenyl)-4H-indeno[1,2-b]thiophen-2-yl)benzo[c][1,2,5]thiadiazol-4-yl)furan-2-carbaldehyde [DJ210]

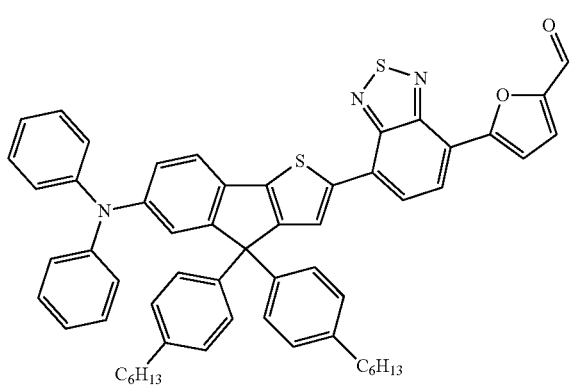

In an argon atmosphere, 4,4-dioctyl,N—N'-diphenyl-4H-indeno[1,2-b]thiophen-6-amine (650 mg, 0.98 mmol) was dissolved in distilled THF (30 mL) after which n-BuLi (0.43 mL, 1.01 mmol) was added at −78° C. The solution was left under agitation for 1 h at −50° C. before adding a solution of Me$_3$SnCl (1.01 mL, 1.01 mmol) in n-hexane at −78° C. After return to ambient temperature, the solution was left under agitation for 2 h. The reaction was stopped with water and the organic phase was extracted with n-hexane, dried over Na$_2$SO$_4$, filtered and concentrated in vacuo. The resulting oil was subjected without further purification to Stille coupling with 4-bromo-7-(4-formylbenzyl)-2,1,3-benzothiadiazole (2433 mg, 0.78 mmol). The stannic product was placed under an argon atmosphere with Pd$_2$dba$_3$ (18 mg, 20 μmol, 2 mol %) and P(o-tolyl)$_3$ (12 mg, 40 μmol). The products were dissolved in anhydrous toluene (20 mL) and placed under reflux for 12 h. The mixture was then poured into HCl (2 M). The organic phase was extracted with diethyl ether (Et$_2$O), washed with HCl (2 M), dried over Na$_2$SO$_4$ and concentrated. The crude solid was purified by silica gel chromatography eluting with cyclohexane/DCM: 6:4 (v/v) whereby a red solid was obtained (490 mg, 0.55 mmol, 70.0%).

$^1$H NMR (CDCl$_3$, 400 MHz): δ=9.72 (s, 1H, CHO), 8.10 (s, 1H, H$_{ar}$), 8.08 (ABq, 2H, Δab=135.9 Hz, J=7.8 Hz, H$_{ar}$), 7.65 (ABq, 2H, Δab=175.7 Hz, J=3.7 Hz, H$_{ar}$), 7.37 (d, 1H, J=8.2 Hz), 7.25-7.18 (m, 5H, H$_{ar}$), 7.10-7.05 (m, 4H, H$_{ar}$), 7.09 (ABq, 8H, Δab=42.0 Hz, J=8.4 Hz), 7.02-6.96 (m, 3H, H$_{ar}$), 2.55 (t, 4H, J=7.3 Hz, CH$_2$), 1.63-1.53 (m, 4H, CH$_2$), 1.38-1.25 (m, 12H, CH$_2$), 0.87 (t, 6H, J=6.8 Hz, CH$_3$).

$^{13}$C NMR (CDCl$_3$, 100 MHz): δ=177.25; 155.99; 155.45; 152.19; 151.80; 147.53; 146.60; 144.31; 141.62; 141.44; 140.76; 131.29; 129.19; 128.29; 127.84; 126.47; 124.64; 124.50; 124.30; 124.12; 123.92; 123.63; 122.97; 122.85; 121.98; 120.37; 119.11; 118.83; 113.88; 63.31; 35.54; 31.72; 31.38; 29.12; 22.60; 14.08.

II.2. 2-cyano-3-(5-(7-(6-(diphenylamino)-4,4-bis(4-hexylphenyl)-4H-indeno[1,2-b]thiophen-2-yl)benzo[c][1,2,5]thiadiazol-4-yl)furan-2-yl)acrylic Acid [DJ214]

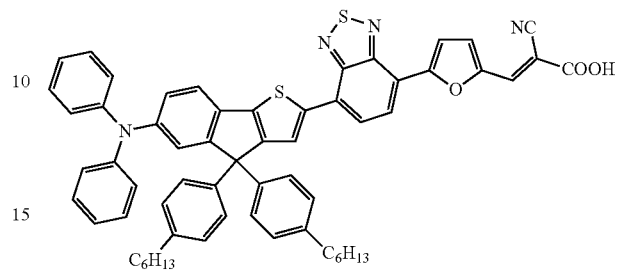

In an argon atmosphere, 5-(7-(6-(diphenylamino)-4,4-bis(4-hexylphenyl)-4H-indeno[1,2-b]thiophen-2-yl)benzo[c][1,2,5]thiadiazol-4-yl)furan-2-carbaldehyde [DJ210] (470 mg, 0.52 mmol) and cyanoacetic acid (225 mg, 2.65 mmol, 5 eq.) were dissolved in a mixture of acetonitrile (60 mL) and chloroform (40 mL). A catalytic amount of piperidine was added and the solution placed under reflux for 3 h. The solvent was removed under reduced pressure and the remaining solid was dissolved in chloroform. The organic phase was washed with a 2M solution of HCl, dried over Na$_2$SO$_4$ and concentrated. The crude solid was purified by silica gel chromatography eluting first with DCM, then DCM/MeOH: 95:5 (v/v) and finally DCM/MeOH/Acetic acid: 90:5:5 (v/v), after which the corresponding dye was obtained in the form of a dark purple solid (472 mg, 0.49 mmol, 93.0%).

$^1$H NMR (THF-d$_8$, 400 MHz): δ=8.40-8.20 (m broad, 2H, H$_{ar}$), 7.09 (s broad, 2H, H$_{ar}$), 7.90 (s broad, 1H, H$_{ar}$), 7.42 (s broad, 2H, H$_{ar}$), 7.30-7.15 (m, 9H, H$_{ar}$), 7.15-6.95 (m, 11H, H$_{ar}$), 2.58 (t, 4H, J=7.4 Hz, CH$_2$), 1.66-1.56 (m, 4H, CH$_2$), 1.43-1.27 (m, 12H, CH$_2$), 0.90 (t, 6H, J=6.7 Hz, CH$_3$).

$^{13}$C NMR (THF-d$_8$, 100 MHz): δ=156.08; 155.47; 154.97; 15.85; 151.34; 148.57; 147.66; 146.61; 144.18; 141.87; 141.12; 136.76; 131.54; 129.02; 128.08; 127.81; 126.46; 124.39; 124.14; 122.82; 122.78; 122.02; 120.23; 118.87; 115.99; 114.74; 63.28; 35.40; 31.71; 31.55; 29.09; 22.49; 13.43.

III. Synthesis of the YKP89 Dye

III.1. 4,4-bis(4-hexylphenyl)-N,N-bis(4-methoxyphenyl)-4H-indeno[1,2-b]thiophen-6-amine [YKC4P85]

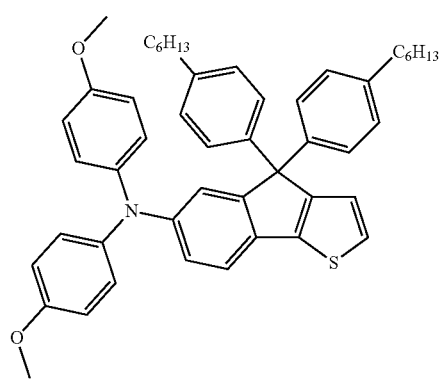

In an argon atmosphere, Pd$_2$dba$_3$ (3.20 mg, 3.50 µmol) and tri-tert-butylphosphine tetrafluoroborate (2.03 mg, 7.0 µmol) were dissolved in anhydrous toluene (5 mL). After agitation for 15 min, a solution of 6-bromo-4,4'-bis(4-hexylphenyl)-4H-indeno[1,2-b]thiophene (200 mg, 349.9 µmol) and 4,4'-dimethoxydiphenylamine (88.2 mg, 384.8 µmol) in anhydrous toluene (10 mL) was added. Potassium tert-butoxide (129.5 mg, 1.15 mmol, 3.3 eq.) was added and the resulting mixture agitated for 30 min at ambient temperature before being placed under reflux for 48 h. The mixture was then filtered through Celite and poured into HCl (2 M). The organic phase was extracted with DCM, washed with water, dried over Na$_2$SO$_4$ and concentrated. The crude oil was purified by silica gel chromatography eluting with n-hexane/DCM: 9:1 (v/v), whereby a pale yellow oil was obtained (230 mg, 319.4 µmol, 91.3%).

$^1$H NMR ((CD$_3$)$_2$CO, 400 MHz): δ=7.41 (d, 1H, J=4.9 Hz, H$_{ar}$), 7.37 (d, 1H, J=8.2 Hz, H$_{ar}$), 7.12-7.06 (m, 10H, H$_{ar}$), 7.01 (m, 4H, H$_{ar}$), 6.88 (m, 4H, H$_{ar}$), 6.98 (m, 7H, H$_{ar}$), 6.81 (d d, 1H, J=2.1 Hz, J=8.2 Hz, H$_{ar}$), 3.80 (s, 6H, OCH$_3$), 2.58 (t, 4H, CH$_2$), 1.60 (m, 4H, CH$_2$), 1.33 (m, 12H, CH$_2$), 0.89 (t, 6H, CH$_3$).

$^{13}$C NMR ((CD$_3$)$_2$CO, 100 MHz): δ=156.05; 154.99; 154.68; 146.99; 142.24; 141.16; 140.92; 129.99; 128.17; 127.66; 126.81; 126.13; 123.30; 119.54; 114.66; 62.74; 54.85; 35.17; 31.54; 31.36; 22.37; 13.45.

III.2. 5-(7-(6-(bis(4-methoxyphenyl)amino)-4,4-bis(4-hexylphenyl)-4H-indeno[1,2-b]thiophen-2-yl)benzo[c][1,2,5]thiadiazol-4-yl)furan-2-carbaldehyde [YKC4P86]

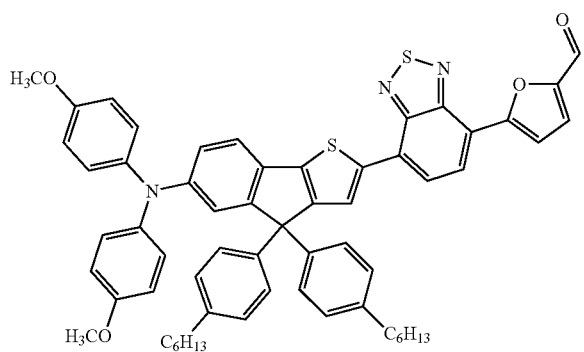

In an argon atmosphere, 4,4-bis(4-hexylphenyl)-N,N-bis(4-methoxyphenyl)-4H-indeno[1,2-b]thiophen-6-amine [YKC4P85] (200 mg, 0.28 mmol) was dissolved in distilled THF (15 mL). After bringing the solution to −78° C., n-BuLi (213 µL, 319 µmol, 1.15 eq.) was added. The solution was left under agitation for 1 h at −78° C. before adding a solution of Me$_3$SnCl (417 µL, 417 µmol, 1.5 eq.) in n-hexane at −78° C. After return to ambient temperature, the solution is left under agitation for 2 h. The reaction was stopped with saturated ammonium chloride solution. The organic phase was extracted with n-hexane, washed with water, dried over Na$_2$SO$_4$, filtered and concentrated in vacuo. The resulting oil was subjected without further purification to Stille coupling with 5-(7-bromobenzo[c][1,2,5]thiadiazol-4-yl)furan-2-carbaldehyde (69 mg, 222 µmol, 0.8 eq.). The stannic product was placed under an argon atmosphere with Pd$_2$dba$_3$ (5.1 mg, 5.56 µmol, 2 mol %) and P(o-tolyl)$_3$ (3.37 mg, 11.11 µmol, 4 mol %). The products were dissolved in anhydrous toluene (20 mL) and placed under reflux for 24 h. The mixture was then poured into HCl (2 M). The organic phase was extracted with DCM, washed with water, dried over Na$_2$SO$_4$ and concentrated. The crude solid was purified by silica gel chromatography eluting with DCM/n-hexane: 6:4 (v/v), whereby a dark purple solid of aldehyde type was obtained (199 mg, 209 µmol, 94.4%).

$^1$H NMR (CD$_2$Cl$_2$, 200 MHz): δ=9.69 (s, 1H, CHO), 8.13 (s, 1H, H$_{ar}$), 8.07 (ABq, 2H, Δvab=58.4 Hz, J=8.1 Hz, H$_{ar}$), 7.64 (ABq, 2H, Δvab=84.0 Hz, J=3.5 Hz, H$_{ar}$), 7.32 (d, 2H, J=8.2 Hz, H$_{ar}$), 7.15-6.99 (m, 13H, H$_{ar}$), 6.80 (m, 5H, H$_{ar}$), 7.08-6.98 (m, 12H, H$_{ar}$), 3.78 (S, 6H, OCH$_3$), 2.56 (t, 4H, J=7.5 Hz, CH$_2$), 1.54 (m, 4H, CH$_2$), 1.30 (m, 12H, CH$_2$), 0.87 (t, 6H, J=6.7 Hz, CH$_3$).

$^{13}$C NMR (CD$_2$Cl$_2$, 50 MHz): δ=177.74; 156.71; 155.86; 152.53; 148.43; 145.04; 142.49; 142.33; 141.28; 141.00; 129.80; 129.48; 128.96; 128.37; 127.12; 126.91; 124.97; 124.49; 120.93; 120.15; 119.74; 119.27; 115.23; 114.36; 63.84; 56.07; 36.12; 32.40; 32.20; 29.78; 23.28; 14.54.

III.3. 3-(5-(7-(6-(bis(4-methoxyphenyl)amino)-4,4-bis(4-hexylphenyl)-4H-indeno[1,2-b]thiophen-2-yl)benzo[c][1,2,5]thiadiazol-4-yl)furan-2-yl)-2-cyanoacrylic Acid [YKP89]

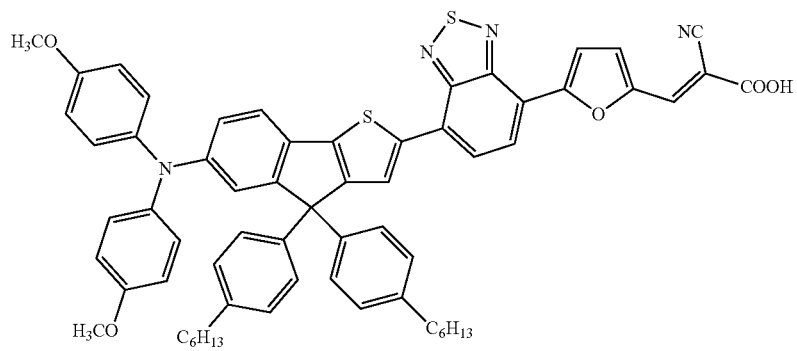

In an argon atmosphere, 5-(7-(6-(bis(4-methoxyphenyl)amino)-4,4-bis(4-hexylphenyl)-4H-indeno[1,2-b]thiophen-2-yl)benzo[c][1,2,5]thiadiazol-4-yl)furan-2-carbaldehyde [YKC4P86] (180 mg, 190 µmol) and cyanoacetic acid (80 mg, 950 µmol, 5 eq.) were dissolved in a mixture of acetonitrile (9 mL) and chloroform (9 mL). A catalytic amount of piperidine was added and the solution placed under reflux for 3 h. The solvent was removed under reduced pressure and the remaining solid was dissolved in chloroform. The organic phase was washed with a solution of HCl (2 M), dried over $Na_2SO_4$ and concentrated. The crude solid was purified by silica gel chromatography eluting first with DCM, then DCM/methanol (MeOH): 95:5 (v/v) and finally with DCM/MeOH/Acetic acid: 90:5:5 (v/v), whereby the corresponding dye is obtained in the form of a dark purple solid (179.3 mg, 177 µmol, 92.7%).

$^1$H NMR (THF-$d_8$, 400 MHz): δ=8.26 (s, 1H, $H_{ar}$), 8.25 (ABq, 2H, Δvab=88.7 Hz, J=7.7 Hz, $H_{ar}$), 8.04 (s, 1H, $H_{ar}$), 7.70 (ABq, 2H, Δvab=184.3 Hz, J=3.6 Hz, $H_{ar}$), 7.36 (d, 1H, 1=8.3 Hz, $H_{ar}$), 7.13 (m, 3H, $H_{ar}$), 7.09 (d, 1H, J=2.1 Hz, $H_{ar}$), 7.04-6.97 (m, 7H, $H_{ar}$), 6.79 (m, 4H, $H_{ar}$), 3.75 (S, 6H, $H_{ar}$), 2.55 (t, 4H, J=7.9 Hz, $CH_2$), 1.57 (m, 4H, $CH_2$), 1.29 (m, 12H, $CH_2$), 0.87 (t, 6H, J=6.5 Hz, $CH_3$).

$^{13}$C NMR (THF-$d_8$, 100 MHz): δ=190.60; 188.79; 175.94; 156.24; 155.35; 152.63; 152.37; 151.51; 148.49; 147.78; 142.11; 141.01; 140.73; 139.77; 139.71; 133.58; 128.00; 127.79; 126.19; 124.52; 124.29; 123.99; 120.00; 119.62; 118.99; 118.67; 114.67; 114.39; 63.22; 54.59; 35.43; 31.74; 31.60; 29.67; 29.14; 22.52; 13.45.

IV. Synthesis of the YKP137 Dye.

IV.1. N,N-bis(4-(hexyloxy)phenyl)-4,4-bis(4-hexylphenyl)-4H-indeno[1,2-b]thiophen-6-amine [YKP131]

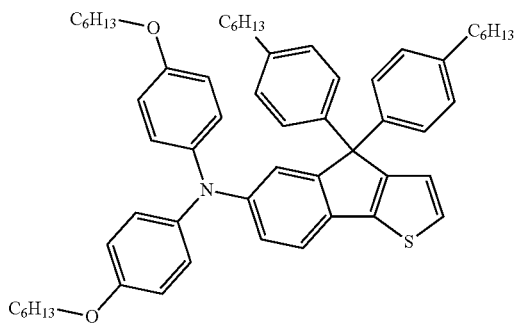

In an argon atmosphere, $Pd_2dba_3$ (6.40 mg, 7.0 µmol) and tri-tert-butylphosphine tetrafluoroborate (4.1 mg, 14.0 µmol) were dissolved in anhydrous toluene (5 mL). After agitation for 15 min, a solution of 6-bromo-4,4'-bis(4-hexylphenyl)-4H-indeno[1,2-b]thiophene (400 mg, 699.7 µmol) and di(hexyloxyphenyl)amine (284.4 mg, 769.7 µmol, 1.1 eq.) in anhydrous toluene (10 mL) was added. Potassium tert-butoxide (259.1 mg, 2.31 mmol, 3.3 eq.) was added and the resulting mixture was left under agitation for 30 min at ambient temperature before being placed under reflux for 48 h. The mixture was then filtered through Celite and poured into HCl (2 M). The organic phase was extracted with DCM, washed with water, dried over $Na_2SO_4$ and concentrated. The crude oil was purified by silica gel chromatography eluting with n-hexane/DCM: 9:1 (v/v), whereby a pale yellow oil was obtained (353 mg, 410 µmol, 58.7%).

$^1$H NMR (CDCl$_3$, 400 MHz): δ=7.42 (d, 1H, J=4.9 Hz, $H_{ar}$), 7.38 (d, 1H, J=8.2 Hz, $H_{ar}$), 7.13-7.07 (m, 10H, $H_{ar}$), 7.01 (m, 4H, $H_{ar}$), 6.88 (m, 4H, $H_{ar}$), 6.98 (m, 7H, $H_{ar}$), 6.82 (d d, 1H, J=2.1 Hz, J=8.2 Hz, $H_{ar}$), 4.00 (t, 4H, J=6.5 Hz, $OCH_2$), 2.59 (t, 4H, J=7.6 Hz, $CH_2$), 1.80 (m, 4H, $CH_2$), 1.62 (m, 4H, $CH_2$), 1.52 (m, 4H, $CH_2$), 1.36 (m, 20H, $CH_2$), 0.9 (d t, 12H, $CH_3$).

$^{13}$C NMR (CDCl$_3$, 100 MHz): δ=157.02; 156.45; 156.13; 148.51; 143.73; 142.61; 142.27; 131.40; 129.63; 129.14; 128.23; 127.58; 124.77; 121.14; 121.10; 120.99; 116.72; 69.38; 64.20; 36.66; 33.03; 32.94; 32.85; 27.08; 23.88; 23.85; 14.90; 14.88.

IV.2. 4-(7-(6-(bis(4-(hexyloxy)phenyl)amino)-4,4-bis(4-hexylphenyl)-4H-indeno[1,2-b]thiophen-2-yl)benzo[c][1,2,5]thiadiazol-4-yl)benzaldehyde [YKC4P134]

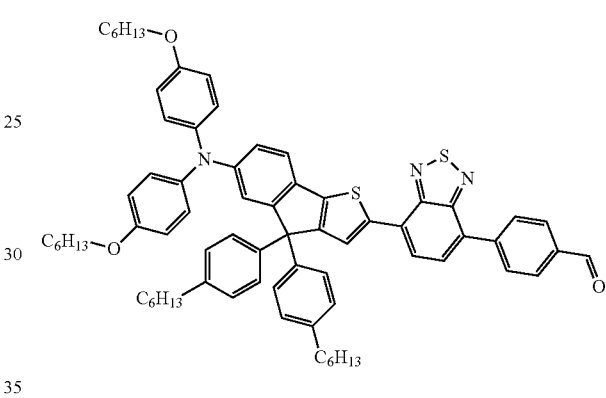

In an argon atmosphere, N,N-bis(4-(hexyloxy)phenyl)-4,4-bis(4-hexylphenyl)-4H-indeno[1,2-b]thiophen-6-amine [YKP131] (300 mg, 348.7 µmol) was dissolved in distilled THF (20 mL). After bringing the solution to −78° C., n-BuLi (287 µL, 401 µmol, 1.15 eq.) was added. The solution was left under agitation for 1 h at −78° C. before adding a solution of $Me_3SnCl$ (523 µL, 523 µmol, 1.5 eq.) in n-hexane at −78° C. After return to ambient temperature, the solution was left under agitation for 2 h. The reaction was stopped with a saturated ammonium chloride solution. The organic phase was extracted with n-hexane, washed with water, dried over $Na_2SO_4$, filtered and concentrated in vacuo. The resulting oil was subjected without further purification to Stille coupling with 4-bromo-7-(4-formylbenzyl)-2,1,3-benzothiadiazole (99 mg, 310.4 µmol, 0.89 eq.). The stannic product was placed under an argon atmosphere with $Pd_2dba_3$ (6.4 mg, 7.0 µmol, 2 mol %) and P(o-tolyl)$_3$ (4.2 mg, 14.0 µmol, 4 mol %). The products were dissolved in anhydrous toluene (30 mL) and placed under reflux for 24 h. The mixture was then poured into HCl (2 M). The organic phase was extracted with DCM, washed with water, dried over $Na_2SO_4$ and concentrated. The crude solid was purified by silica gel chromatography eluting with DCM/n-hexane: 5:5 (v/v), whereby a purple solid of aldehyde type was obtained (275 mg, 250 µmol, 80.6%).

$^1$H NMR (CD$_2$Cl$_2$, 400 MHz): δ=10.17 (s, 1H, CHO), 8.32 (s, 1H, $H_{ar}$), 8.30 (d, 2H, J=8.3 Hz, $H_{ar}$), 8.10 (m, 3H, $H_{ar}$), 7.97 (d, 1H, J=7.6 Hz, $H_{ar}$), 7.48 (d, 1H, J=8.3 Hz, $H_{ar}$), 7.21-7.13 (m, 8H, $H_{ar}$), 7.09 (d, 1H, J=3.1 Hz, $H_{ar}$), 7.05 (m, 4H, $H_{ar}$), 6.90 (m, 4H, $H_{ar}$), 6.85 (dd, 1H, J=2.2 Hz, J=8.3 Hz, $H_{ar}$), 4.01 (t, 4H, J=6.5 Hz, $OCH_2$), 2.60 (t, 4H,

J=7.8 Hz, CH$_2$), 1.80 (m, 4H, CH$_2$), 1.62 (m, 4H, CH$_2$), 1.52 (m, 4H, CH$_2$), 1.35 (m, 20H, CH$_2$), 0.9 (dt, 12H, CH$_3$).

$^{13}$C NMR (CD$_2$Cl$_2$, 100 MHz): δ=192.59; 156.77; 156.14; 154.58; 153.20; 148.83; 144.68; 143.84; 142.97; 142.32; 141.47; 141.31; 137.05; 131.07; 131.05; 130.69; 130.45; 130.23; 130.17; 129.28; 128.75; 127.42; 125.31; 125.07; 121.20; 120.37; 119.83; 116.28; 68.89; 36.17; 32.52; 32.43; 32.35; 26.58; 23.38; 23.33; 14.41; 14.38.

IV.3. 3-(4-(7-(6-(bis(4-(hexyloxy)phenyl)amino)-4,4-bis(4-hexylphenyl)-4H-indeno[1,2-b]thiophen-2-yl)benzo[c][1,2,5]thiadiazol-4-yl)phenyl)-2-cyanoacrylic Acid [YKP137]

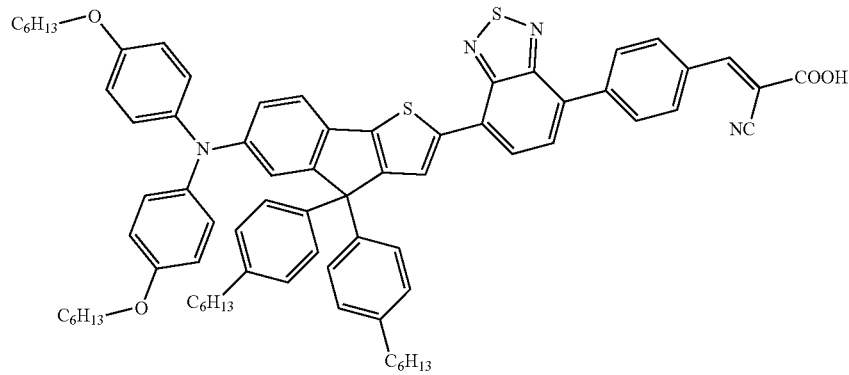

In an argon atmosphere, 4-(7-(6-(bis(4-(hexyloxy)phenyl)amino)-4,4-bis(4-hexylphenyl)-4H-indeno[1,2-b]thiophen-2-yl)benzo[c][1,2,5]thiadiazol-4-yl)benzaldehyde [YKC4P134] (275 mg, 250.3 μmol) and cyanoacetic acid (213 mg, 2.5 mmol, 10 eq.) were dissolved in a mixture of acetonitrile (20 mL) and chloroform (10 mL). A catalytic amount of piperidine was added and the solution placed under reflux for 3 h. The solvent was removed under reduced pressure and the remaining solid dissolved in chloroform. The organic phase was washed with a solution of HCl (2 M), dried over Na$_2$SO$_4$ and concentrated. The crude solid was purified by silica gel chromatography eluting first with DCM, then with DCM/MeOH 95:5 (v/v) and finally with DCM/MeOH/Acetic acid: 90:5:5 (v/v), whereby the corresponding dye was obtained in the form of a dark purple-blue solid (252.5 mg, 217 μmol, 86.5%).

$^1$H NMR (THF-d$_8$, 400 MHz): δ=8.32 (m, 3H, H$_{ar}$), 8.24 (s, 1H, H$_{ar}$), 8.22 (m, 2H, H$_{ar}$), 8.01 (ABq, 2H, Δvab=41.8 Hz, J=7.6 Hz, H$_{ar}$), 7.36 (d, 1H, J=8.3 Hz, H$_{ar}$), 7.13 (m, 4H, H$_{ar}$), 7.09 (d, 1H, J=2.1 Hz, H$_{ar}$), 7.03 (m, 4H, H$_{ar}$), 6.97 (m, 4H, H$_{ar}$), 6.81 (d, 1H, J=2.1 Hz, H$_{ar}$), 6.78 (m, 4H, H$_{ar}$), 3.92 (t, 4H, J=6.4 Hz, OCH$_2$), 2.55 (t, 4H, J=7.6 Hz, CH$_2$), 1.58 (m, 4H, CH$_2$), 1.49 (m, 4H, CH$_2$), 1.36-1.31 (m, 20H, CH$_2$), 0.90 (dt, 12H, CH$_3$).

$^{13}$C NMR (THF-d$_8$, 100 MHz): δ=163.93; 156.64; 156.20; 154.50; 153.82; 153.33; 148.65; 144.82; 143.13; 142.40; 141.95; 141.61; 141.33; 132.44; 131.79; 130.41; 129.66; 128.95; 128.77; 127.09; 125.11; 124.89; 120.81; 120.59; 120.03; 115.88; 68.73; 64.22; 36.39; 32.70; 32.54; 30.33; 30.10; 26.75; 23.53; 23.47; 14.40.

V. Optical Properties of the Dyes of the Invention

To demonstrate the advantages of the dyes of the invention and in particular of the dyes DJ214, YKP88, YKP89 and YKP137 synthesized as described above, two dyes described in the literature were used as reference i.e.:

the RK1 dye corresponding to 2-cyano-3(4-(7-(5-(4-(diphenyl amino)phenyl)-4-octylthiophen-2-yl)benzo[c][1,2,5] thiadiazol-4-yl)phenyl)acrylic acid of formula:

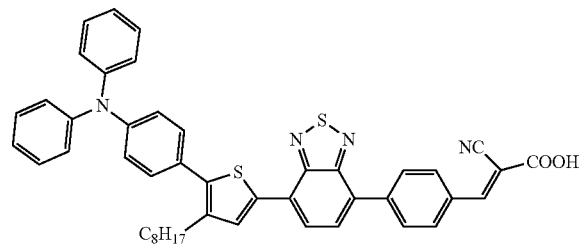

the RKF dye corresponding to 2-cyano-3-(4-(7-(6-(diphenylamino)-4,4-dihexyl-4H-indeno[1,2-b]thiophen-2-yl)benzo[c][1,2,5]thiadiazol-4-yl)phenyl)acrylic acid of formula:

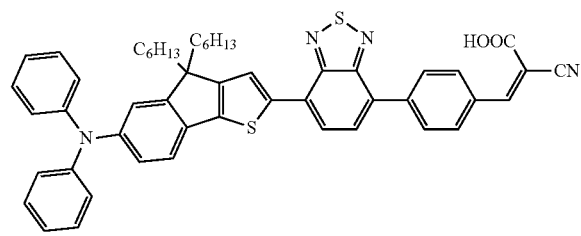

It is very clearly apparent that the dyes of the invention exhibit improved absorption spectra compared with prior art dyes such as RK1 or RKF having efficiencies higher than 9.5% in combination with an iodine-based electrolyte which are among the highest in the literature.

Figure 2:
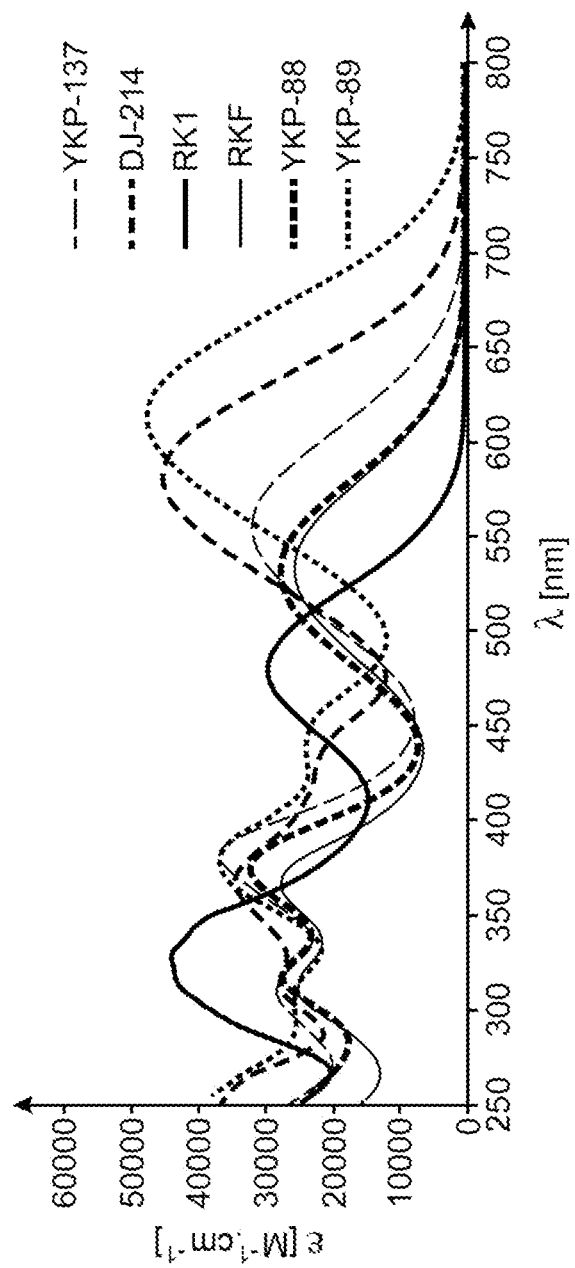
FIG. 2 gives the absorption spectrum of the dyes of the invention (YKP88, YKP89, YKP137 and DJ214) in solution in chloroform, compared with the reference dyes RK1 and RKF, published in the article by Joly et al, 2015 [17].

The spectra of the compounds of the invention, namely YKP137, DJ214, YKP88 and YKP89, are particularly well suited for applications to solar cells since they have spectral shift in the visible region compared with RK1 or RKF and/or have higher absorption coefficients (FIG. 2).

Interestingly, the compounds DJ214 and YKP89 prove to have molar absorption coefficients higher than 40000 $M^{-1} \cdot cm^{-1}$. The high absorption coefficients allow the envisaging of applications with ionic liquid electrolyte and solid electrolyte configurations. In these configurations, to allow good penetration of the viscous electrolyte into the mesoporous electrode, the thickness of the mesoporous films must remain narrow and in particular narrower than 8 µm. In this case, the small thickness is compensated for by a strong absorption of the dye.

VI. Dyes of the Invention and Cells with Liquid Electrolyte

VI.1. Material and Methods

A. Preparation of Devices with Liquid Electrolyte

The $TiO_2$ films were purchased from Solaronix, then treated with $TiCl_4$ and sintered at 500° C. for 30 min. After cooling, the electrodes were immersed in a solution containing the dyes in a mixture with deoxycholic acid (DCA) for 3 to 12 h at ambient temperature.

For the counter-electrode, the FTO plates (Fluorine-doped Tin Oxide) were drilled with a micro-drill bit, washed with a 0.1 $mol \cdot L^{-1}$ solution of HCl in ethanol, then washed in a bath subjected to ultrasound with water and ethanol for 15 min. A counter-electrode in platinum was prepared by pouring 5 mM of chloroplatinic acid ($H_2PtCl_6$) in isopropyl alcohol under gravity onto the washed FTO plates, followed by sintering at 400° C. for 20 min under controlled atmosphere. The electrodes having adsorbed the dye were rinsed with ethanol and dried under a stream of nitrogen. The electrodes having adsorbed the dye were assembled and sealed with the counter-electrode using thermal adhesive films (Surlyn, Dupont 1702, thickness: 25 µm) as polymer separators to produce sandwich-type cells. The liquid electrolyte was composed of 0.7 $mol \cdot L^{-1}$ of 1-propyl-3-methylimidazolium iodide, 0.03 $mol \cdot L^{-1}$ iodine, 0.1 $mol \cdot L^{-1}$ lithium iodide and 0.5 $mol \cdot L^{-1}$ tert-BP in a mixture of acetonitrile and valeronitrile (85:15 v/v). An electrolyte solution was inserted via a hole drilled on the counter-electrode. Finally, the holes were sealed with hot melt films and cover strip. The typically active surface area of the cell was about 0.36 $cm^2$.

B. Photovoltaic and Photoelectric Measurements

Photovoltaic measurements of the DSSCs (Dye Sensitized Solar Cells) were performed on a solar simulator (AM 1.5 solar simulator) between the sample and a 450 W xenon excimer lamp. Simulated light intensity was calibrated using a reference Si solar cell equipped with a KG5 filter for global irradiance of about AM 1.5. The photovoltaic characteristics of the DSSCs were obtained by applying polarisation of external potential to the cells and measuring the generated photo-current with a Keithley source meter, 2400 model. The Incident Photon-to-Current conversion Efficiency (IPCE) was measured as a function of the wavelengths from 300 nm to 800 nm using an IPCE system specially adapted for dye-sensitized solar cells. A 75 W xenon lamp was used as light source to generate monochromatic radiation. Calibration was performed using a NIST(National Institute of Standards and Technology)-calibrated silicon photodiode as standard. The IPCE values were collected at a low chopping frequency of 4 Hz. The spectra of electric impedance were measured using an impedance analyser (Solartron 1260) at open-circuit potential under full solar illumination AM 1.5 (100 $mW/cm^2$), over a frequency range of $0.1 \sim 10^5$ Hz. The alternating signal amplitude was 10 mV. Impedance parameters were determined by adjusting the impedance spectra using Z-plot software.

VI.2. Results Obtained

A. Photovoltaic Conversion Efficiencies with Liquid Electrolyte.

To prove that the dyes of the invention exhibiting an improved absorption spectrum allow improvements in photovoltaic conversion efficiency, these dyes were used in sensitized solar cells employing a device of following structure:

Sensitization of a $TiO_2$ on FTO electrode with the dyes,
Crimping with polymer separators and counter-electrode, and filling with liquid electrolyte containing the redox pair and more particular the redox pair $I^-/I_3^-$.

Table 1 below compiles the results of solar cells containing an iodine-based liquid electrolyte.

The Fill Factor (FF) is the quality factor: it translates the capacity of the cell to evacuate photogenerated charges efficiently i.e. the ratio between the maximum power that can be obtained with a cell and theoretical power.

TABLE 1

| Dye 1: CDCA 10 | $V_{oc}$ (mV) | $J_{sc}$ (mA · $cm^{-2}$) | FF (%) | η (%) |
|---|---|---|---|---|
| RK1 | 707 | 16.83 | 71 | 8.44 |
| RKF | 710 | 18.82 | 72 | 9.69 |
| YKP88 | 706 | 18.96 | 71 | 9.54 |
| YKP89 | 662 | 16.89 | 68 | 7.61 |
| YKP137 | 729 | 18.56 | 70 | 9.38 |
| DJ214 | 670 | 17.08 | 71 | 8.09 |

$TiO_2$ thickness 14 (T/SP) + 3 (R/SP) µm. Dye in $CH_3CN$/t-BuOH, 1:1 for 15 h.
Best result for 3 cells of each dye.

Interestingly, it appears that some of the compounds of the invention, all examined under the same conditions, exhibit conversion efficiencies higher than the reference RK1. By means of the shifting of their absorption spectrum in the visible region they collect more photons and consequently they all allow more current (Jsc) to be generated than the reference RK1.

Some of them, such as YKP88 with phenyl groups meeting the chemical structure of the invention, exhibit higher current intensities than the analogue thereof, RKF. In addition, these compounds absorb in wavelength ranges that are particularly sought after for the applications, since they are rare.

Also, the combination of several dyes to sensitize the electrodes of which at least one meets the structure of the invention, allows a significant improvement in efficiencies. This is shown by the results in Tables 2 and 3 below.

TABLE 2

| Dye/CDCA, 1/10 | $V_{oc}$ (mV) | $J_{sc}$ (mA · $cm^{-2}$) | FF (%) | η (%) (best cell) | η (%) (mean of 2 cells) |
|---|---|---|---|---|---|
| RK1 | 724 | 14.54 | 72 | 7.65 | 7.63 |
| RK1/ YKP88, 1/1 | 730 | 15.50 | 71 | 8.10 | 7.96 |
| YKP88 | 707 | 16.25 | 68 | 7.87 | 7.85 |

$TiO_2$ thickness 8 (T/SP) + 4 (R/SP) µm. Dye in $CH_3CN$/t-BuOH, 1:1.
Eluent with 0.5 mM dye + 5 mM CDCA for 3 h.

TABLE 3

| Dye/CDCA, 1/10 | $V_{oc}$ (mV) | $J_{sc}$ (mA·cm$^{-2}$) | FF (%) | η (%) (1 cell) |
|---|---|---|---|---|
| YKP88 | 733 | 17.29 | 73 | 9.23 |
| YKP88/YKP137, 8/2 | 743 | 20.17 | 71 | 10.68 |
| YKP137 | 718 | 19.23 | 69 | 9.57 |

TiO$_2$ thickness 14 (T/SP) + 3 (R/SP) μm. Dye in CH$_3$CN/t-BuOH, 1:1.
Eluent with 0.5 mM dye + 5 mM CDCA for 3 h.

Interestingly, when two compounds derived from the invention (Table 3) are used in combination, the conversion efficiencies reach 10.68%. This performance ranks among the 3 best at world level using an iodine-based electrolyte.

B. Photovoltaic Conversion Efficiencies with Ionic Liquid Electrolyte

It is known in the state of the art that cells containing liquid electrolytes have a propensity to degrade rapidly, this phenomenon often being linked to problems of leakage and evaporation of the solvent.

To overcome these problems, one widely employed strategy is to use an electrolyte containing an ionic liquid. Therefore, the dyes of the invention were also used in sensitized solar cells using a device of following structure:
Sensitization of a TiO$_2$ on FTO electrode with the dyes,
Crimping with polymer separators and counter-electrode, and filling with ionic liquid electrolyte containing the redox pair and more particularly the redox pair I$^-$/I$^{3-}$.

Table 4 below compiles the results of solar cells containing an iodine-based ionic liquid electrolyte.

TABLE 4

| Dye 1: CDCA 10 | $V_{oc}$ (mV) | $J_{sc}$ (mA·cm$^{-2}$) | FF (%) | η (%) |
|---|---|---|---|---|
| RK1 | 651 | 13.81 | 71 | 6.38 |
| RKF | 670 | 17.50 | 67 | 7.87 |
| YKP-88 | 642 | 17.39 | 66 | 7.36 |
| YKP-89 | 585 | 16.98 | 66 | 6.60 |
| YKP-137 | 665 | 14.09 | 60 | 5.65 |
| DJ-214 | 609 | 16.51 | 68 | 6.80 |

TiO$_2$ thickness 8.5 (T/SP + MC/SP) + 3 (R/SP) μm. Dye in CH$_3$CN/t-BuOH, 1:1 for 15 h. Best result for 3 cells of each dye.

Interestingly, all the compounds of the invention with the exception of YKP137 exhibit conversion efficiencies higher than the reference RK1. By means of their improved capacity to collect photons over a wider range of wavelengths, all the compounds allow the generation of more current when used in a cell.

Figure 3:
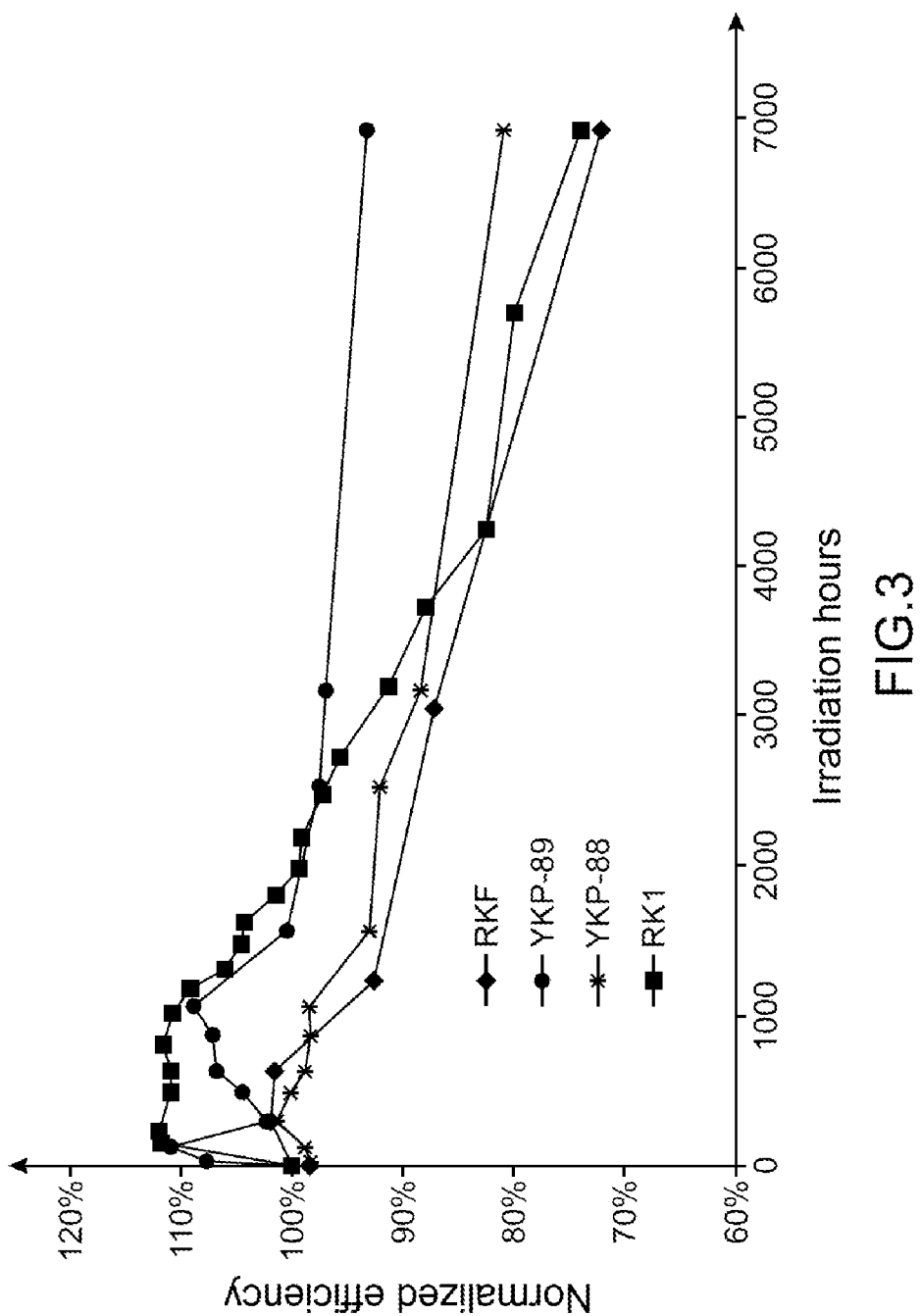
FIG. 3 illustrates the stability of the dyes of the present invention (YKP88 and YKP89) compared with reference dyes (RK1 et RKF) as a function of irradiation time at 1000 W/m$^2$ with UV filter at 65° C.

The most interesting result to be pointed out is that the devices fabricated with the compounds of the invention have highly increased stability (FIG. 3). These stabilities were compared with that of RK1, the only compound to have been examined under these conditions of accelerated degradation (ISOS-L2) and which displays one of the best fatigue strengths in this cell configuration that has ever been reported in the literature.

When the solar cells fabricated with a dye of the present invention were irradiated by 1000 W/m$^2$ at 65° C. for 6900 h, they maintained more than 80% of their initial efficiency compared with only 74% for the reference dye RK1 which currently ranks among the most stable dyes in this field. The substitution of the alkyl groups (RKF) by aromatic groups (its analogue YKP88) clearly brings a beneficial effect since YKP88 displays much better stability than RKF (+9%). As for the YKP89 dye, this exhibits the best stability ever recorded under these conditions for an organic compound, with a 7% loss of efficiency in 7000 h.

VII. Dyes of the Invention and Cells with Solid Electrolyte

The fact that the dyes of the invention have strong molar absorption coefficients is of particular interest for the development of cells with solid electrolyte.

It is possible to replace a liquid electrolyte, that has numerous disadvantages in terms of application (leakage, corrosion, evaporation), by an electrolyte of solid p-type conducting type. This is generally 2,2',7,7'-tetrakis(N,N-dipmethoxypheny-amine)-9,9'-spirobifluorene or Spiro-OMeTAD which is conventionally employed as p-type conductor:

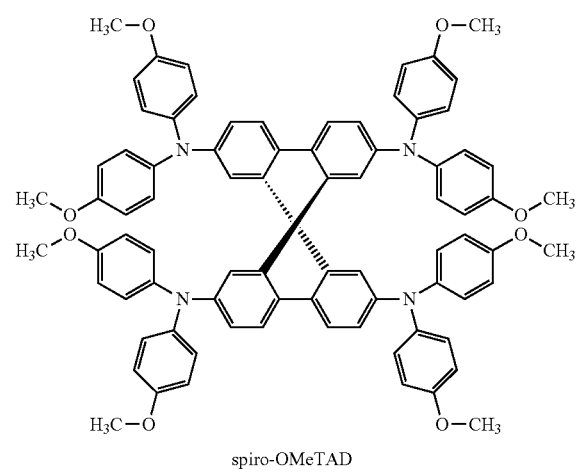

spiro-OMeTAD

Regarding devices with solid electrolyte, one limiting factor concerns the penetration of the electrolyte into the mesoporous oxide layer. It is extremely difficult to impregnate layers of thickness greater than 3 μm with solid electrolytes. It is therefore advantageous to use organic dyes with strong absorption coefficient to allow thickness to be reduced without however losing out on light-collection efficiency.

VII.1. Material and Methods

Devices with solid electrolyte were fabricated with dyes of the invention and compared with a reference molecule in the field: RK1.

The cell structure used was the following: FTO/dense TiO$_2$/mesoporous TiO$_2$(2 μm)/dye/Spiro-OMeTAD/Au (Active surface area: 0.15 cm$^2$)

The procedure employed for fabrication applied the following main steps:
depositing compact layers of TiO$_2$ (250 nm) (hole-blocking) via spray pyrolysis onto etched glass/FTO substrates;
depositing porous layers of TiO$_2$ using a commercial paste of DYESOL trademark, calcining heat treatment, thickness obtained 3 μm;
sensitizing with dyes RK1, YKP88 or YKP137, in particular for between 5 and 24 h with 0.2 mM of dye in a mixture of tert-butanol/acetonitrile (50:50 by volume)+2 mM chenodeoxycholic acid (CDCA);
sensitization: 15 h in the dark at ambient temperature+ rinsing with acetonitrile (ACN);
filling the pores with «spiro-OMeTAD» molecular glass (Merck) with 200 mg/ml spiro-OMeTAD in chlorobenzene, doped tert-BP and Li-TFSI;
depositing a gold counter-electrode (a few hundred nanometres thick) via vacuum evaporation (10$^{-6}$ mbar).

VII.2. Results Obtained

Preliminary results (non-optimized) obtained in solid electrolyte configuration with the dyes of the invention i.e. YKP88 and YKP137 and with the reference RK1 are given in Table 5 below.

TABLE 5

| Dye 1: CDCA 10 | $V_{oc}$ (mV) | $J_{sc}$ (mA·cm$^{-2}$) | FF (%) | η (%) |
|---|---|---|---|---|
| RK1 | 772 | 9.17 | 58 | 4.11 |
| YKP88 | 927 | 9.63 | 50 | 4.50 |
| YKP137 | 815 | 10.25 | 47 | 3.90 |

These results again show the superiority of the dyes of the invention (YKP88 and YKP137) which, in solid electrolyte cells, provide more current (higher than 9.5 mA/cm$^2$) and lead to obtaining equivalent or better results in terms of conversion efficiency than the reference dye (RK1).

BIBLIOGRAPHY

[1] O'Regan and Grätzel, 1991, «A low-cost, high-efficiency solar cell based on dye-sensitized colloidal TiO$_2$ films», Nature, vol. 353, pages 737-740.
[2] Grätzel, 2009, «Recent advances is mesoscopic solar cells», Acc. Chem. Res., vol. 42, pages 1781-1798.
[3] Mishra et al, 2009, «Metal-Free Organic Dyes for Dye-Sensitized Solar Cells: From Structure: Property Relationships to Design Rules», Angew. Chem. Int. Ed., vol. 48, pages 2474-2499.
[4] Yan et al, 2010, «Effect of surface etching on the efficiency of ZnO-based dye-sensitized solar cells», Langmuir, vol. 26, pages 7153-7156.
[5] Idigoras et al, 2015, «Organic dyes for the sensitization of nanostructured ZnO photoanodes: effect of the anchoring functions», RSC Adv., vol. 5, pages 68929-68938.
[6] Ooyama et Harima, 2009, «Molecular designs and syntheses of organic dyes for dye-sensitized solar cells», Eur. J. Org. Chem., vol. 2009, pages 2903-2934.
[7] Wang et al, 2005, «A high molar extinction coefficient sensitizer for stable dye-sensitized solar cells», J. Am. Chem. Soc., vol. 127, pages 808-809.
[8] International application WO 2009/109499 by BASF SE published on 11 Sep. 2009.
[9] Chen et at 2007, «Effect of tetrahydroquinoline dye structure on the performance of organic dye-sensitized solar cells», Chem. Mater., vol. 19, pages 4007-4015.
[10] Wu et al, 2010, «Efficient and stable dye-sensitized solar cells based on phenothiazine sensitizers with thiophene units», J. Mater. Chem., vol. 20, pages 1772-1779.
[11] Xu et al, 2008, «New triphenylamine-based dyes for dye-sensitized solar cells», J. Phys. Chem. C, vol. 112, pages 874-880.
[12] Liu et al, 2008, «Simple organic molecules bearing a 3,4-ethyledioxythiophene linker for efficient dye-sensitized solar cells», Chem. Commun., vol. 2008, pages 5152-5154.
[13] Zeng et al, 2010, «Efficient dye-sensitized solar cells with an organic photosensitizer featuring orderly conjugated ethylenedioxythiophene and dithienosilole blocks», Chem. Mater., vol. 22, pages 1915-1925.
[14] Mathew et al, 2014, «Dye-sensitized solar cells with 13% efficiency achieved through the molecular engineering of porphyrin sensitizers», Nat. Chem., vol. 6, pages 242-247.
[15] Joly et al, 2014, «A robust organic dye for dy-sensitized solar cells based on iodine/iodide electrolytes combining high efficiency and outstanding stability», Sci. Rep., vol. 4, 4033.
[16] International application WO 2013/068588 by CEA published on 16 May 2013.
[17] Joly et al, 2015, «Metal-free organic sensitizer with narrow absorption in the visible for solar cells exceeding 10% efficiency», Energy Environ. Sci., vol. 8, pages 2010-2018.
[18] Kalyanasundaram K., 2010, «Dye Sensitized Solar Cells», (ed.), EPFL Press, ISBN: 978-2-940222-36-0 CRC Press ISBN 978-1-4398-0866-5.

What is claimed is:

1. Organic dye corresponding to one of the following structures (I) or (II):

eD-pi-conjugated chromophore-L-A  (I)

A-L-pi-conjugated chromophore-eD  (II)

where:
eD represents an electron-donor segment,
L represents a covalent bond or a spacer segment and in particular a pi-conjugated spacer segment,
A represents an electron-attractor segment capable of forming a covalent bond with a semiconductor,
wherein the pi-conjugated chromophore comprises at least one unit of formula

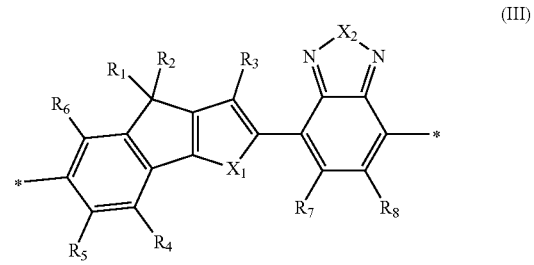

(III)

where:
the radicals $R_1$ and $R_2$, the same or different, are an optionally substituted aryl group;
the radicals $R_3$ to $R_8$, the same or different, are a hydrogen, an optionally substituted alkyl group or optionally substituted aryl group; and
$X_1$ and $X_2$, the same or different are selected from among S, Se and O.

2. The organic dye according to claim 1, wherein said pair $(X_1,X_2)$ represents (S,S), (O,O) or (Se,Se) and in particular (S,S).

3. The organic dye according to claim 1, wherein in said unit (III), said radicals $R_4$ to $R_6$ are the same and/or the radicals $R_7$ and $R_8$ are the same, said radicals $R_4$ to $R_6$ preferably all representing a hydrogen and/or the radicals $R_7$ and $R_8$ preferably all representing a hydrogen.

4. The organic dye according to claim 1, wherein in said unit (III), said radical $R_3$ represents a hydrogen.

5. The organic dye according to claim 1, wherein in said unit (III), said radicals $R_1$ and $R_2$ are the same and represent an optionally substituted aryl group and in particular an aryl group substituted by an optionally substituted alkyl group.

6. The organic dye according to claim 1, wherein said unit (III) is of formula (IV):

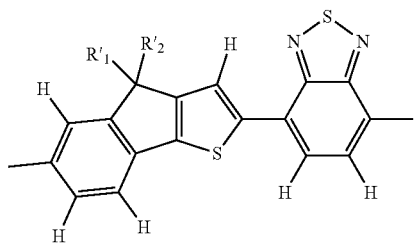

(IV)

where the radicals R'$_1$ and R'$_2$ are the same and represent —C$_6$H$_4$—C$_6$H$_{13}$.

7. The organic dye according to claim 1, wherein said electron-donor segment (eD) is an amino group of (Z$_1$)(Z$_2$) N-type with Z$_1$ and Z$_2$, the same or different, representing an optionally substituted alkyl group or optionally substituted aryl group.

8. The organic dye according to claim 1, wherein said electron-acceptor segment (A) is a carboxylic acid group, cyanoacrylic acid group, phosphonic group, dithiocarboic group or a group corresponding to any one of the following formulas:

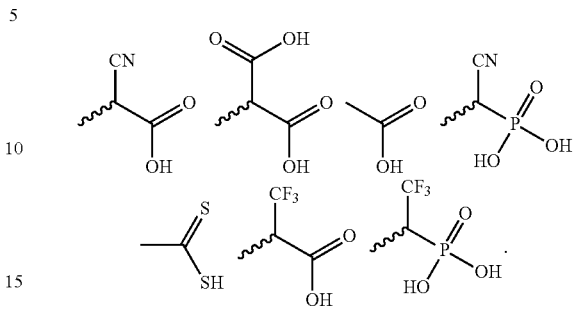

9. The organic dye according to claim 1, wherein said spacer L is a pi-conjugated function such as an optionally substituted alkenylene or alkynylene chain and/or an optionally substituted arylene chain.

10. The organic dye according to claim 1, wherein said organic dye is selected from among the following compounds:

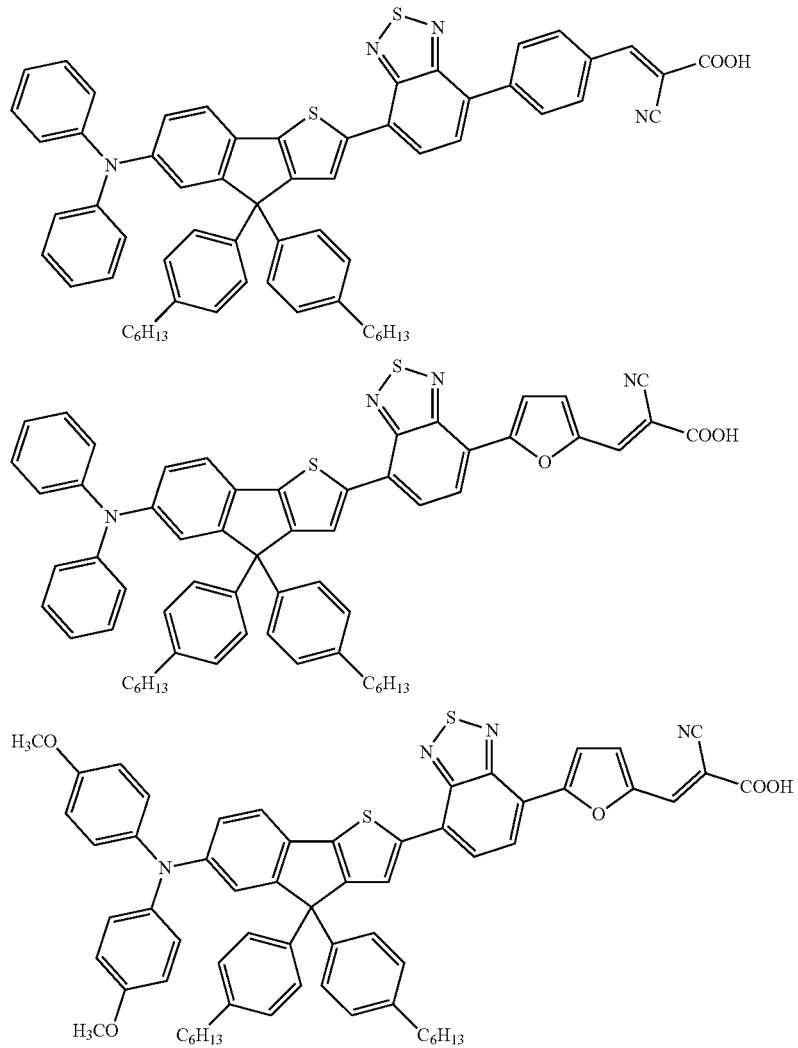

-continued

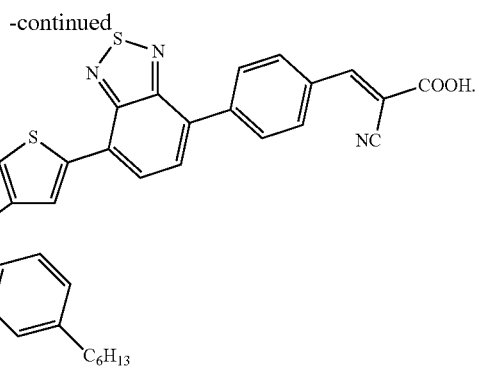

11. Use of an organic dye such as defined in claim 1 as photosensitizer in a photovoltaic device.

12. Photovoltaic device having a nanostructured semiconductor metal oxide layer sensitized by at least one organic dye such as defined in claim 1.

13. The photovoltaic device according to claim 12, wherein said photovoltaic device further comprises two electrodes, designated anode and counter-electrode in the invention, and separated from each other by an electrolyte and optionally polymer separators.

14. The photovoltaic device according to claim 12, wherein the semiconductor metal oxide is a binary, tertiary or quaternary metal oxide.

15. The photovoltaic device according to claim 12, wherein said electrolyte is a liquid, an ionic liquid, a gel or a solid.

* * * * *

UNITED STATES PATENT AND TRADEMARK OFFICE
CERTIFICATE OF CORRECTION

PATENT NO. : 10,655,016 B2  
APPLICATION NO. : 16/099623  
DATED : May 19, 2020  
INVENTOR(S) : Renaud Demadrille et al.

Page 1 of 1

It is certified that error appears in the above-identified patent and that said Letters Patent is hereby corrected as shown below:

In the Specification

Column 6, formula (IV), "R2" should read -- R'2 --.

Column 13, Line 46, "1=0.3 Hz," should be -- J=0.3 Hz," --.

Column 13, Line 46, "1=8.3 Hz," should be -- J=8.3 Hz, --.

Column 14, Line 26, "1=8.0 Hz," should be -- J=8.0 Hz, --.

Column 17, Line 55, "1=7.8 Hz," should be -- J=7.8 Hz, --.

Column 21, Line 20, "1=8.3 Hz," should be -- J=8.3 Hz, --.

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*